(12) United States Patent
Okuda et al.

(10) Patent No.: US 7,800,421 B2
(45) Date of Patent: Sep. 21, 2010

(54) INFORMATION PROCESSING APPARATUS AND PHASE CONTROL METHOD

(75) Inventors: Hayato Okuda, Kawasaki (JP); Hiroyuki Matsuo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 293 days.

(21) Appl. No.: 11/945,573

(22) Filed: Nov. 27, 2007

(65) Prior Publication Data
US 2008/0122503 A1 May 29, 2008

(30) Foreign Application Priority Data
Nov. 29, 2006 (JP) ............... 2006-322413

(51) Int. Cl.
*H03L 7/06* (2006.01)
(52) U.S. Cl. .............................. 327/158; 327/141
(58) Field of Classification Search ................ 327/141, 327/155, 161
See application file for complete search history.

(56) References Cited

U.S. PATENT DOCUMENTS

| 5,481,573 A | * | 1/1996 | Jacobowitz et al. ......... 375/356 |
| 5,742,798 A | * | 4/1998 | Goldrian .................... 713/400 |
| 6,111,712 A | * | 8/2000 | Vishakhadatta et al. ...... 360/51 |
| 2005/0138457 A1 | * | 6/2005 | Gomm et al. ............... 713/401 |
| 2009/0015304 A1 | * | 1/2009 | Yin et al. .................... 327/162 |

FOREIGN PATENT DOCUMENTS

| JP | 62-269434 | 11/1987 |
| JP | 10-240375 | 9/1998 |

* cited by examiner

*Primary Examiner*—Lincoln Donovan
*Assistant Examiner*—Ryan C Jager
(74) *Attorney, Agent, or Firm*—Fujitsu Patent Center

(57) ABSTRACT

An apparatus includes plural combinations of a clock supplier and a clock supply destination supplied with a clock from the clock supplier. The clock supply destination includes a return route through which the clock supply destination returns a clock to a corresponding clock supplier. The clock supplier includes a variable delay unit that adds a delay to the clock to be supplied to a corresponding clock supply destination; a comparison-reference-clock supply unit that supplies a comparison reference clock having the same phase as that of a comparison reference clock supplied from other clock supplier; a phase comparator that compares the phase of a return clock returned from a corresponding clock supply destination with that of the comparison reference clock; and a phase-difference control unit that controls the delay, so that the phases of the return clock and the comparison reference clock coincide with each other, based on the comparison result.

4 Claims, 14 Drawing Sheets

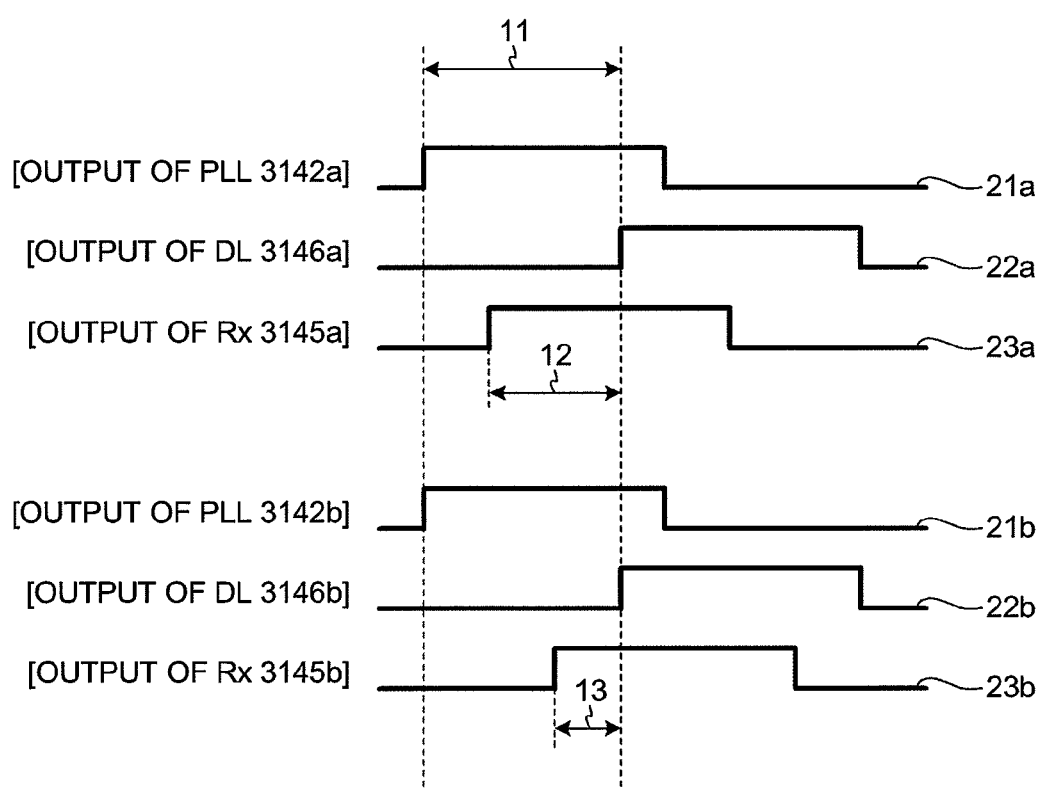

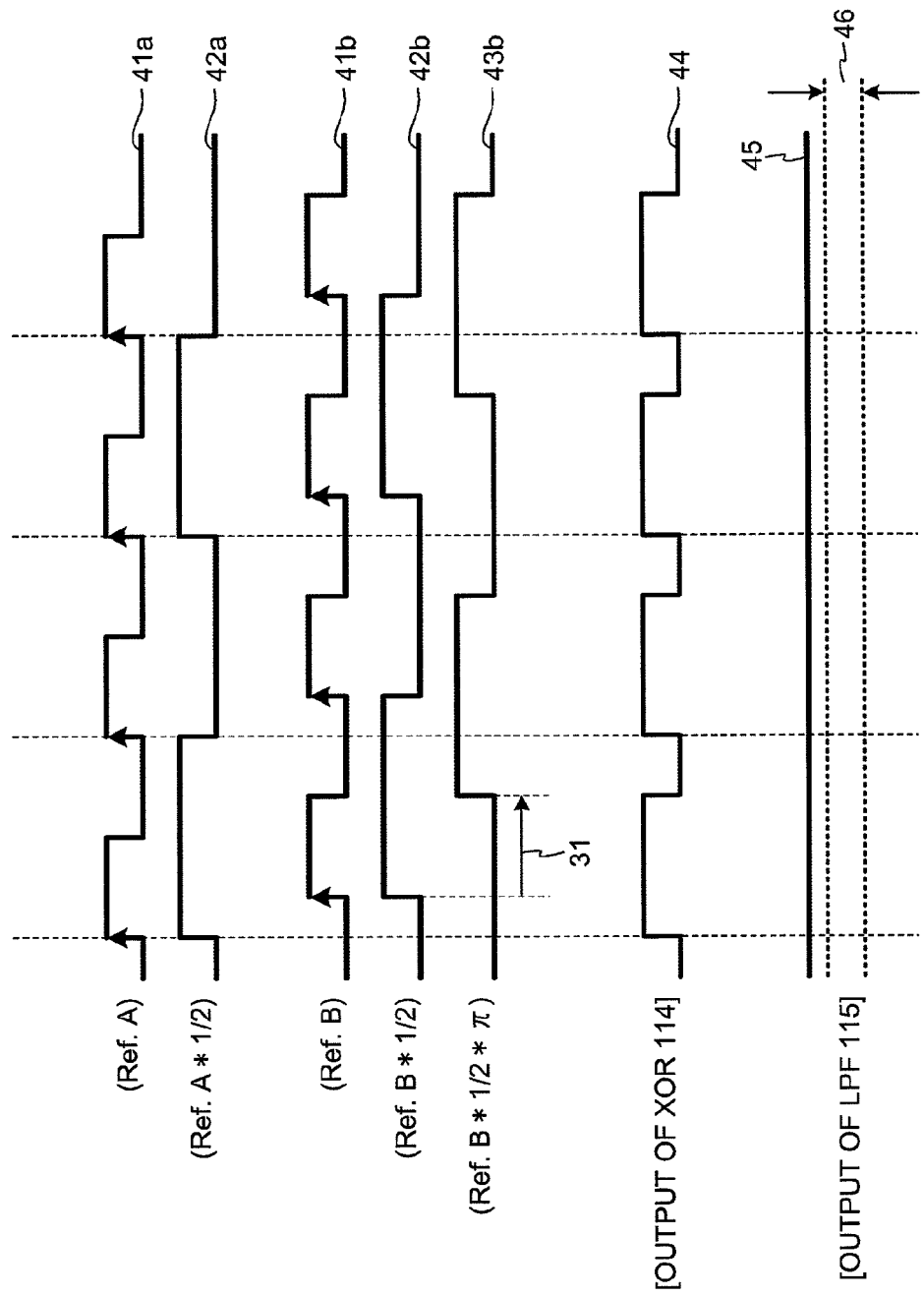

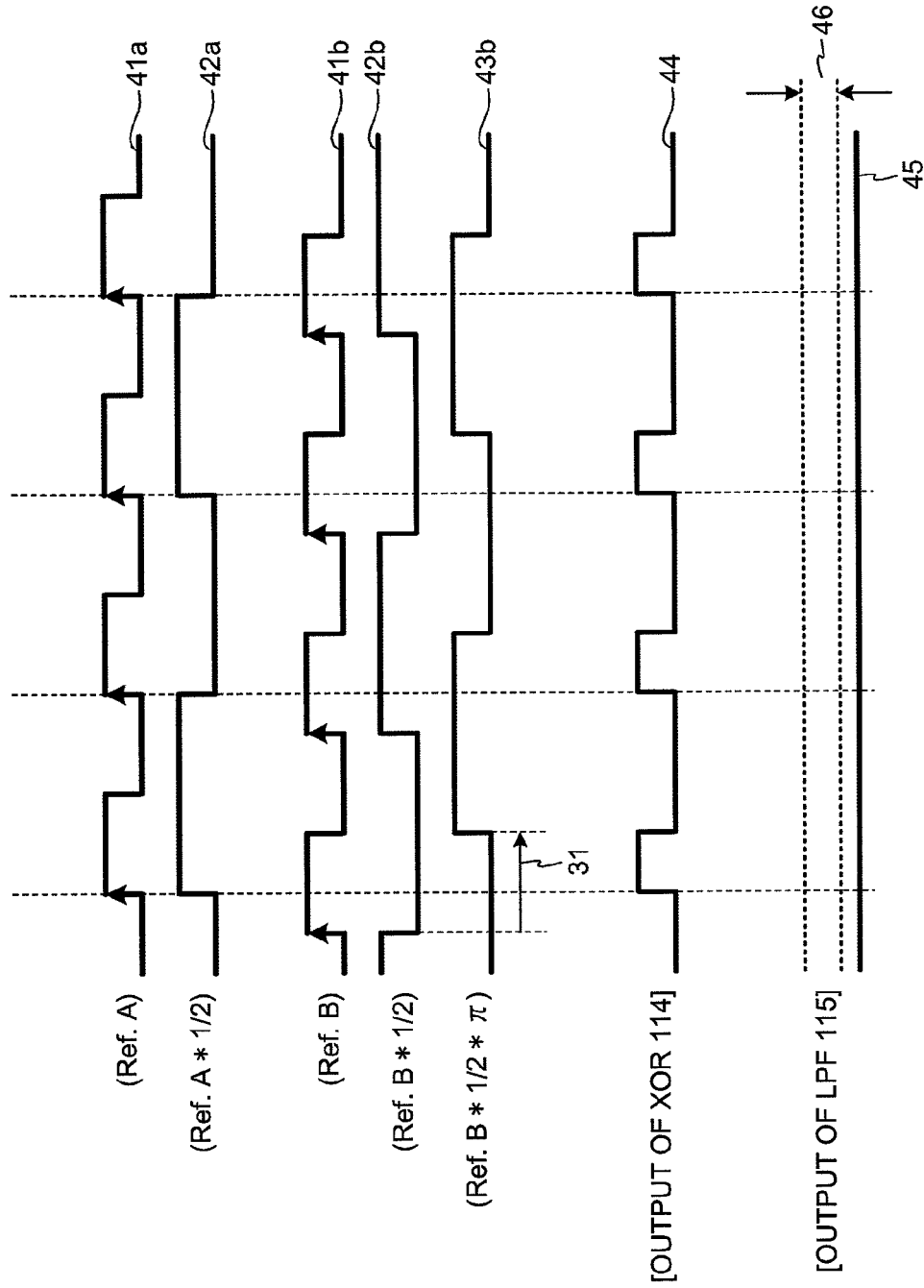

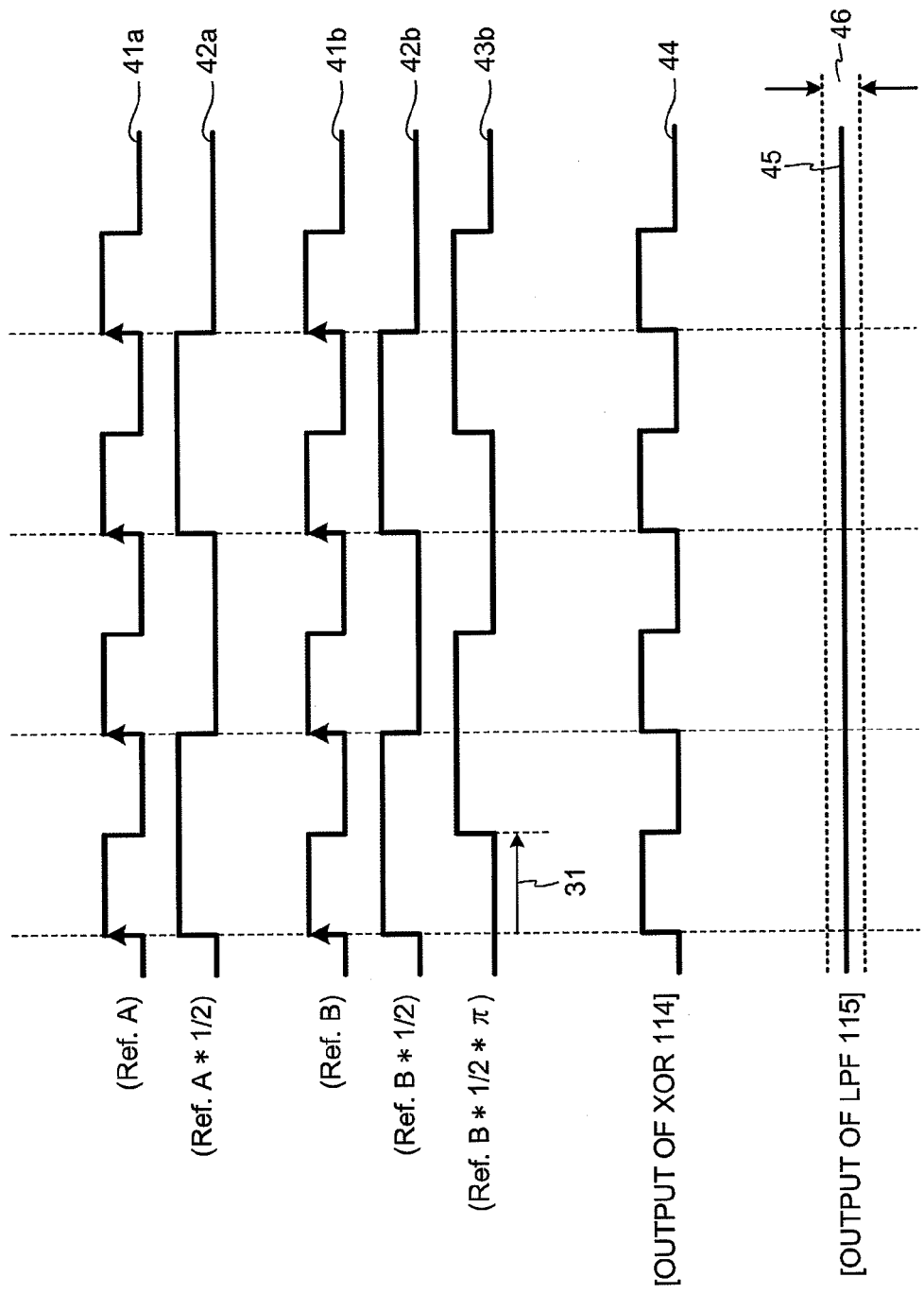

INFORMATION PROCESSING APPARATUS AND PHASE CONTROL METHOD

BACKGROUND OF THE INVENTION

1. Field of the Invention

The present invention relates to an information processing apparatus and a phase control method of controlling the phases of clocks that are supplied to redundant systems to synchronize the clocks, and more particularly to an information processing apparatus and a phase control method capable of flexibly carrying out phase control in high precision.

2. Description of the Related Art

In a network requiring high reliability, a communication route is made redundant, and a communication device having a redundant configuration is employed to constitute the network. The communication device having a redundant configuration has, for example, a duplex configuration including a current system and a standby system. When a trouble occurs in the configuration of the current system, the network relays the process to the configuration of the standby system, thereby avoiding an interruption of communications.

In the communication device having the duplex configuration, reference clocks that control the operation timing of various kinds of process are independently supplied to the current system and the standby system to increase the availability. However, when there is a phase difference between the phase of the reference clock supplied to the current system and the phase of the reference clock supplied to the standby system, a transmission/reception error of a main signal occurs at the time of changeover between the current system and the standby system, and the communication line is momentarily disconnected.

To prevent the occurrence of this trouble, it is necessary to correct the phase difference between the phases of the reference clocks supplied to the redundant systems and accurately synchronize the reference clocks. Conventional techniques of correcting a phase difference between phases of reference clocks are disclosed in Japanese Patent Application Laid-open No. S62-269434 and Japanese Patent Application Laid-open No. H10-240375.

Japanese Patent Application Laid-open No. S62-269434 discloses the following technique. A return loop is provided to return a reference clock transmitted from a supplier to a supply destination, to a supplier. A length of a cable connected between the supplier and the supply destination is obtained based on a result of measuring a loop resistance of a return loop, thereby adjusting a delay amount given to the reference clock.

Japanese Patent Application Laid-open No. H10-240375 discloses the following technique. Fixed delay units, each having a different delay amount, are provided at plural stages in a reference-clock supply destination. A reference clock, output from a fixed delay unit, having the smallest phase difference between a phase of a reference clock of a current system and a phase of a reference clock of a standby system is selectively used.

However, recently, the speed of the reference clock has been increased along with the increase in the communication speed. Therefore, according to the method of adjusting a delay amount by obtaining a cable length based on a result of measuring a loop resistance like the technique disclosed in Japanese Patent Application Laid-open No. S62-269434, it is difficult to adjust the delay amount in sufficient precision.

Further, according to the method using the fixed delay unit like the technique disclosed in Japanese Patent Application Laid-open No. H10-240375, it is not possible to flexibly cope with a phase difference between the phases of the reference clocks generated due to various factors such as a tolerance of a cable length and individual differences of various kinds of mounted parts. Therefore, a correctable range of the phase difference is limited.

SUMMARY OF THE INVENTION

It is an object of the present invention to at least partially solve the problem in the conventional technology.

According to an aspect of the present invention, an information processing apparatus includes plural combinations of a clock supplier and a clock supply destination supplied with a clock from the clock supplier. The clock supply destination includes a return route through which the clock supply destination returns a clock supplied from a corresponding clock supplier to the corresponding clock supplier. The clock supplier includes a variable delay unit that adds a delay of a variable amount to the clock to be supplied to a corresponding clock supply destination; a comparison-reference-clock supply unit that supplies a comparison reference clock having the same phase as that of a comparison reference clock supplied from other clock supplier; a phase comparator that compares the phase of a return clock returned from a corresponding clock supply destination with the phase of the comparison reference clock supplied from the comparison-reference-clock supply unit; and a phase-difference control unit that controls the delay added by the variable delay unit, so that the phase of the return clock coincides with the phase of the comparison reference clock, based on a result of comparison by the phase comparator.

According to another aspect of the present invention, an information processing apparatus includes plural combinations of a clock supplier and a clock supply destination supplied with a clock from the clock supplier; and a phase-difference control unit that carries out a control to correct a phase difference. The clock supply destination includes a return route through which the clock supply destination returns a clock supplied from a corresponding clock supplier to the corresponding clock supplier. The clock supplier includes a variable delay unit that adds a delay of a variable amount to the clock to be supplied to a corresponding clock supply destination; and a phase comparator that compares the phase of a return clock returned from a corresponding clock supply destination with the phase of a clock branched before the clock is added with the delay by the variable delay unit, and the phase-difference control unit controls the delay added by the variable delay unit so that the phases of clocks supplied from all clock suppliers coincide with each other, based on a result of comparison by the phase comparator.

According to still another aspect of the present invention, a phase control method is performed in an apparatus that includes plural combinations of a clock supplier and a clock supply destination supplied with a clock from the clock supplier. The method includes, in the clock supplier, adding a delay of a variable amount to the clock to be supplied to a corresponding clock supply destination; in the clock supply destination, returning a clock supplied from a corresponding clock supplier to the corresponding clock supplier; in the clock supplier, supplying a comparison reference clock having the same phase as that of a comparison reference clock supplied from other clock supplier; in the clock supplier, comparing the phase of a return clock returned from a corresponding clock supply destination with the phase of the comparison reference clock supplied; and in the clock supplier, controlling the delay added, so that the phase of the return clock coincides with the phase of the comparison reference clock, based on a result of the comparing.

According to still another aspect of the present invention, a phase control method is performed in an apparatus that includes plural combinations of a clock supplier and a clock supply destination supplied with a clock from the clock supplier; and a phase-difference control unit that carries out a control to correct a phase difference. The method includes, in the clock supplier, adding a delay of a variable amount to the clock to be supplied to a corresponding clock supply destination; in the clock supply destination, returning a clock supplied from a corresponding clock supplier to the corresponding clock supplier; in the clock supplier, comparing the phase of a return clock returned from a corresponding clock supply destination with the phase of a clock branched before the clock is added with the delay; and in the phase-difference control unit, controlling the delay added, so that the phases of clocks supplied from all clock suppliers coincide with each other, based on a result of the comparing.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 2A is a timing chart of an operation before correcting a phase difference;

FIG. 4A is a timing chart of an operation of a phase comparator when there is a phase difference;

FIG. 4B is another timing chart of an operation of the phase comparator when there is a phase difference;

FIG. 4C is a timing chart of an operation of the phase comparator when clocks are synchronized;

DETAILED DESCRIPTION OF THE PREFERRED EMBODIMENTS

Exemplary embodiments of an information processing apparatus and a phase control method according to the present invention will be explained below in detail with reference to the accompanying drawings. In the following embodiments, application of the present invention to a transmission device of the synchronous optical network (SONET)/the synchronous digital hierarchy (SDH) network is explained. However, the present invention is not limited to the embodiments.

Figure 8:
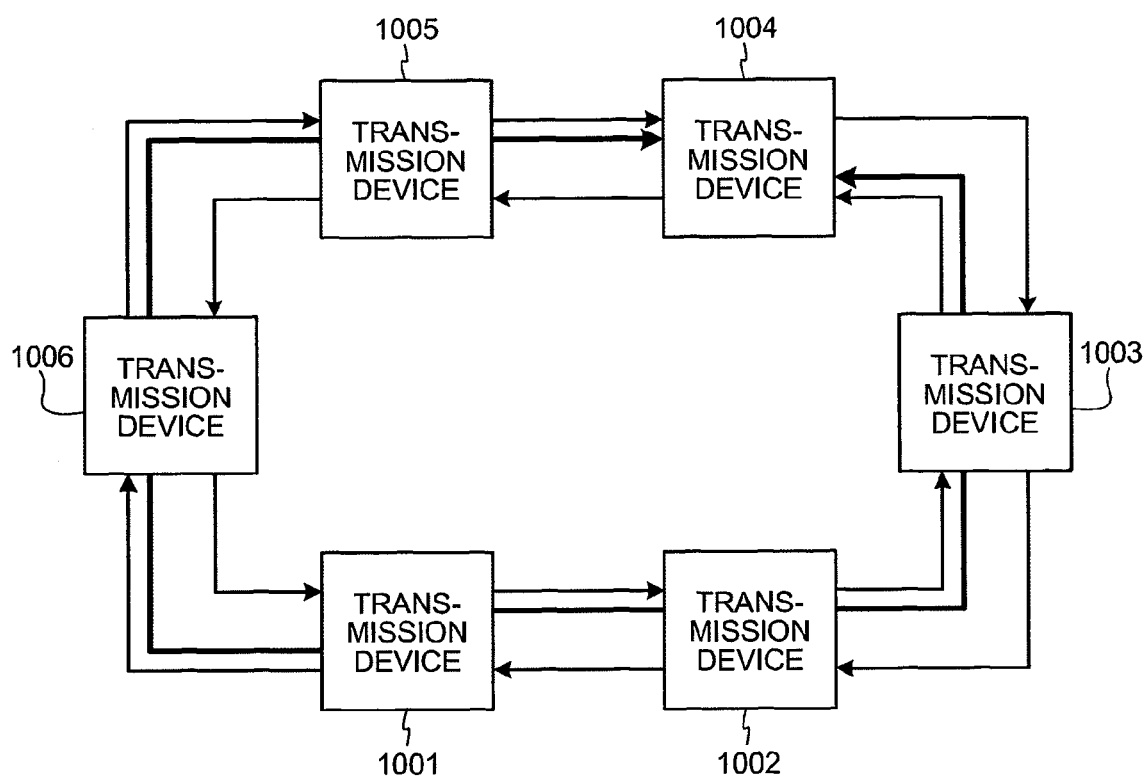
FIG. 8 is one example of an SONET/SDH network which is made redundant by a UPSR system.

First, the SONET/SDH network is explained taking examples. FIG. 8 is one example of the SONET/SDH network which is made redundant by the Unidirectional Path Switched Ring (UPSR) system. As shown in FIG. 8, the SONET/SDH network is configured by connecting communication devices called transmission devices, in a ring shape, using optical fiber cables.

In the example shown in FIG. 8, transmission devices 1001 to 1006 are connected in a ring shape. For example, the transmission device 1001 is connected to the transmission device 1002 at one side and is connected to the transmission device 1006 at the other side. One of the connections in the two directions is called the EAST side and the other side is called the WEST side.

The SONET/SDH network also includes a redundant mechanism called a ring protection. In the example shown in FIG. 8, the transmission device 1001 has set two paths, having the same channel number in the EAST direction and the WEST direction, to transmit signals to the transmission device 1004. The transmission device 1001 transmits the same signals to the transmission device 1004 through these two paths.

The transmission device 1004 receives the same signals from the two directions, and selects the signal transmitted through the path in the state of good quality and abandons the signal transmitted through the other path. By setting the duplex pats in this way, even when a trouble occurs in one of the two paths, the other path can be used to maintain the communication state. The redundant system shown in this example is called the UPSR system.

The configurations of the transmission devices 1001 to 1006 shown in FIG. 8 are explained next. The transmission devices 1001 to 1006 are conventional shelf-type transmission devices, and each transmission device includes a body called a shelf having plural slots, and various kinds of cards mounted on the slots. Each of the transmission devices 1001 to 1006 has a similar configuration, and therefore the configuration of the transmission device 1001 is explained as an example.

Figure 9:
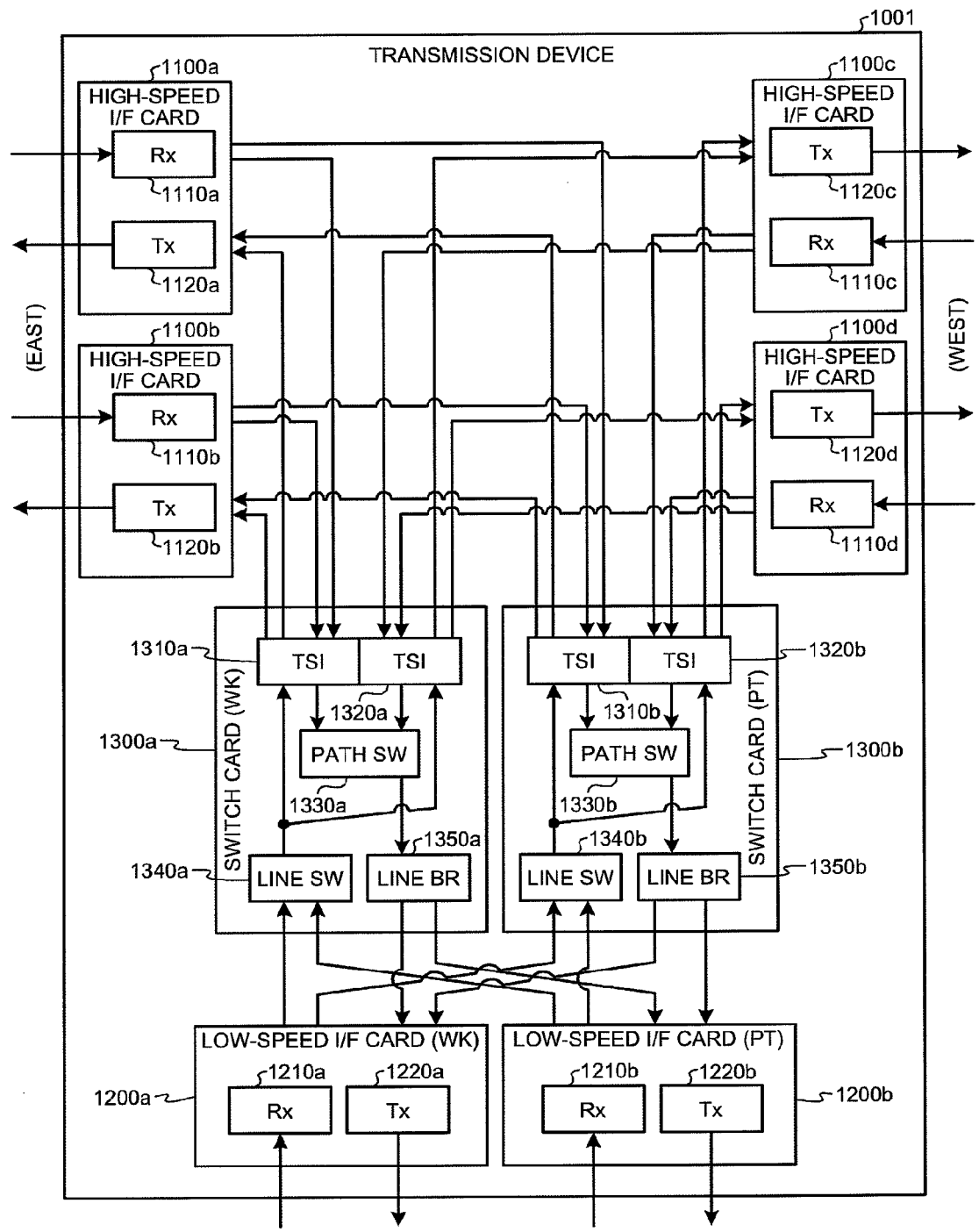
FIG. 9 is a block diagram of a configuration of a conventional shelf-type transmission device.

FIG. 9 is a block diagram of the configuration of the conventional shelf-type transmission device 1001. As shown in FIG. 9, the transmission device 1001 is mounted with high-speed interface cards (hereinafter, "high-speed I/F cards") 1100a to 1100d, low-speed interface cards (hereinafter, "low-speed I/F cards") 1200a and 1200b, and switch cards 1300a and 1300b. In FIG. 9, to simplify the explanation, configurations of parts of the transmission device 1001 other than those which are relevant to the transmission and reception of a main signal are omitted.

The high-speed I/F card 1100a is an interface card to which optical fiber cables constituting the ring network are connected, and includes a receiver (Rx: receiver) 1110a and a transmitter (Tx: transmitter) 1120a. The high-speed I/F cards 1100b to 1100d are interface cards similar to the high-speed I/F card 1100a, and include a receiver 1110b and a transmitter 1120b, a receiver 1110c and a transmitter 1120c, and a receiver 1110d and a transmitter 1120d, respectively.

The low-speed I/F card 1200a is an interface card to which cables of the Ethernet® or the like connected to the ring network are connected, and includes a receiver 1210a and a transmitter 1220a. The low-speed I/F card 1200b is an interface card similar to the low-speed I/F card 1200*a*, and includes a receiver 1210*b* and a transmitter 1220*b*. To increase the availability of the low-speed I/F cards, these cards have a redundant configuration such that the low-speed I/F card 1200*a* is used as the working system (WK: working), and the low-speed I/F card 1200*b* is used as the standby system (PT: protected).

The switch card 1300*a* is a control card that carries out a cross connect process and a protection switch process, and includes time slot interchanges (TSI) 1310*a* and 1320*a*, a path switch (Path SW) 1330*a*, a line switch (Line SW) 1340*a*, and a line bridge (Line BR) 1350*a*.

The TSI 1310*a* is a processor that carries out the cross connect process, and is connected to the high-speed I/F cards 1100*a* to 1100*d*, the path switch 1330*a*, and the line switch 1340*a*. Similarly, the TSI 1320*a* is also a processor that carries out the cross connect process, and is connected to the high-speed I/F cards 1100*a* to 1100*d*, the path switch 1330*a*, and the line switch 1340*a*. To increase the availability, the TSI 1310*a* and the TSI 1320*a* have a redundant configuration such that the TSI 1310*a* is used as the working system and the TSI 1320*a* is used as the standby system.

The path switch 1330*a* is a processor that carries out the protection switch process, and is connected to the TSI 1310*a* and the TSI 1320*a*, and the line bridge 1350*a*. The line switch 1340*a* is a switch that transmits one of signals received by the low-speed I/F card 1200*a* and the low-speed I/F card 1200*b*, to the TSIs 1310*a* and 1320*a*. The line bridge 1350*a* is a bridge that transmits a signal transmitted from the path switch 1330*a*, to the TSI 1310*a* or the TSI 1320*a*.

The switch card 1300*b* is a control card that carries out the cross connect process and the protection switch process, and includes TSIs 1310*b* and 1320*b*, a path switch 1330*b*, a line switch 1340*b*, and a line bridge 1350*b*. The switch cards 1300*a* and 1300*b* have similar configurations, and have a redundant configuration such that the switch card 1300*a* is used as the working system and the switch card 1300*b* is used as the standby system, to increase the availability.

The operation of the transmission system 1001 is explained by assuming that the ring protection of the UPSR system is applied to the transmission device 1001 and that the low-speed I/F card 1200*a*, the switch card 1300*a*, and the TSI 1310*a* are the working systems.

When the receiver 1110*a* of the high-speed I/F card 1100*a* at the EAST side receives a signal, this signal is transmitted to the TSI 1310*a*. Upon receiving this signal, the TSI 1310*a* confirms the path through which this signal is transmitted. When the path is not dropped in the corresponding transmission device, the TSI 1310*a* transmits the received signal to the high-speed I/F card 1100*c* or 1100*d*, following the route set in advance, and transfers the signal to the adjacent transmission device at the WEST side. Based on the above operation, the process of transferring the signal not destined to the corresponding transmission device to the transmission device at the opposite side is achieved.

On the other hand, when the path through which the signal is transmitted is dropped in the corresponding transmission device, the TSI 1310*a* transmits this signal to the path switch 1330*a*. The path switch 1330*a* understands, in a channel unit, which one of the paths at the EAST side and the WEST side has superior line quality, from the detection state of a path alarm.

Upon receiving the signal from the TSI 1310*a*, the path switch 1330*a* confirms the channel through which the signal is transmitted. When the path switch 1330*a* understands that the line quality at the WEST side is superior in this channel, the path switch 1330*a* abandons this signal. When the path switch 1330*a* understands that the line quality at the EAST side is superior in this channel, the path switch 1330*a* transmits this signal to the low-speed I/F card 1200*a* via the line bridge 1350*a*, and transfers this signal to the network connected to the low-speed I/F card 1200*a*.

When the receiver 1210*a* of the low-speed I/F card 1200*a* receives a signal, this signal is transmitted to the line switch 1340*a*. Upon receiving this signal, the line switch 1340*a* transmits this signal to the TSI 1310*a*. The TSI 1310*a* transfers the received signal to the adjacent transmission device at the EAST side via the high-speed I/F card 1100*a* or 1100*b*, and transfers the signal to the adjacent transmission device at the WEST side via the high-speed I/F card 1100*c* or 1100*d*, following the route set in advance. Based on the above operation, the ring protection of the UPSR system can be achieved.

As explained above, the transmission device 1001 achieves very high reliability, by making the communication route redundant by the ring protection and by making the internal configuration redundant.

While FIG. 9 depicts the example that the four high-speed I/F cards, the two low-speed I/F cards, and the two switch cards are mounted on the slots held by the transmission device 1001, the numbers of cards mounted on the transmission device 1001 are not limited to the above numbers, and the transmission device 1001 can also have other cards mounted thereon as well.

When it is desired to increase the line capacity of the ring network, this can be achieved by increasing the number of high-speed I/F cards to be mounted. To achieve the ring network of a very large capacity, when it becomes necessary to mount more cards than the number of slots held by the transmission device 1001, a transmission device including plural shelves can be used in place of the transmission device 1001.

Figure 10:
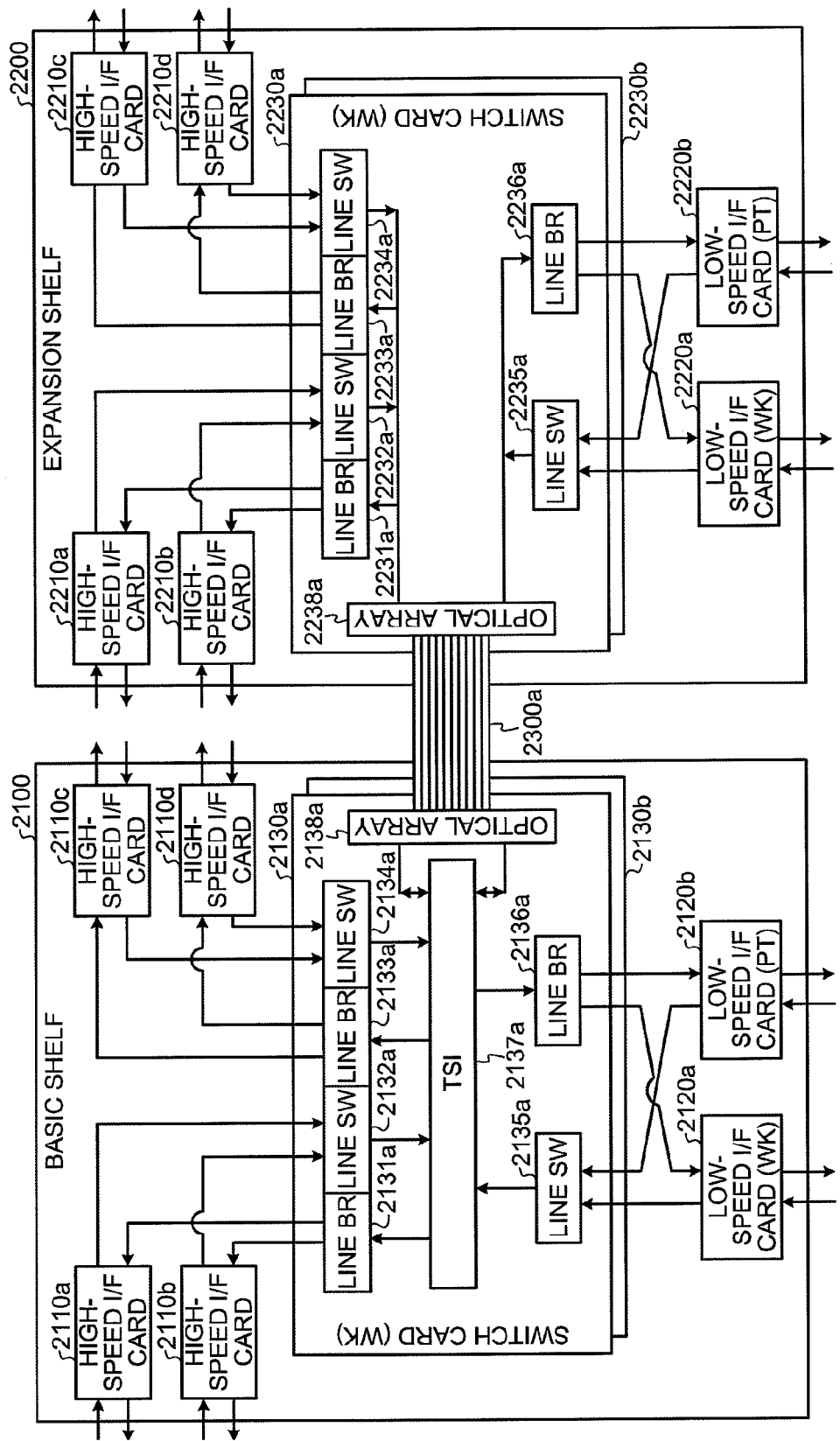
FIG. 10 is a block diagram of a configuration of a transmission device including plural shelves.

The configuration of a transmission device including plural shelves is explained next. FIG. 10 is a block diagram of the configuration of a transmission device 2000 including plural shelves. As shown in FIG. 10, the transmission device 2000 includes two shelves of a basic shelf 2100 and an expansion shelf 2200. In FIG. 10, to simplify the explanation, configurations of parts of the transmission device 2000 other than those which are relevant to the transmission and reception of a main signal are omitted.

The basic shelf 2100 is essential for the transmission device 2000 to operate, and is mounted with high-speed I/F cards 2110*a* to 2110*d*, low-speed I/F cards 2120*a* and 2120*b*, and switch cards 2130*a* and 2130*b*. The high-speed I/F cards 2110*a* to 2110*d* are interface cards to which optical fiber cables constituting the ring network are connected. The low-speed I/F cards 2120*a* and 2120*b* are interface cards to which cables of the Ethernet® or the like connected to the ring network are connected.

The switch card 2130*a* is a control card that carries out a cross connect process and a protection switch process, and includes a line bridge 2131*a* and a line switch 2132*a* connected to the high-speed I/F cards 2110*a* and 2110*b*, a line bridge 2133*a* and a line switch 2134*a* connected to the high-speed I/F cards 2110*c* and 2110*d*, a line switch 2135*a* and a line bridge 2136*a* connected to the low-speed I/F cards 2120*a* and 2120*b*, a TSI 2137*a*, and an optical array 2138*a*.

The TSI 2137*a* is a processor that collectively carries out the cross connect process and the protection switch process of all high-speed I/F cards and all low-speed I/F cards held by the basic shelf 2100 and the expansion shelf 2200. The TSI 2137*a* is directly connected to the line bridge 2131*a*, the line switch 2132*a*, the line bridge 2133*a*, the line switch 2134*a*, the line switch 2135*a*, and the line bridge 2136*a*, and is further connected to the line bridges and the line switches on a switch card 2230a of the expansion shelf 2200 connected via an optical transmission cable 2300a.

The optical array 2138a exchanges various kinds of signals between the switch card 2130a and the switch card 2230a via the optical transmission cable 2300a.

The switch card 2130b is a control card that carries out the cross connect process and the protection switch process, and includes a configuration similar to that of the switch card 2130a. While FIG. 10 does not depict the wiring of the switch card 2130b to avoid complexity of the drawing, the switch card 2130b is connected to the high-speed I/F cards 2110a to 2110d, and the low-speed I/F cards 2120a and 2120b, and is also connected to a switch card 2230b of the expansion shelf 2200 via the optical transmission cable (not shown), like the switch card 2130a. To increase the availability, the switch cards 2130a and 2130b have a redundant configuration such that the switch card 2130a is used as the working system and the switch card 2130b is used as the standby system.

The expansion shelf 2200 is additionally provided to increase the line accommodation capacity of the transmission device 2000, and is mounted with high-speed I/F cards 2210a to 2210d, low-speed I/F cards 2220a and 2220b, and switch cards 2230a and 2230b. The high-speed I/F cards 2210a to 2210d are interface cards to which optical fiber cables constituting the ring network are connected. The low-speed I/F cards 2220a and 2220b are interface cards to which cables of the Ethernet® or the like connected to the ring network are connected.

The switch card 2230a is a control card that requests the switch card 2130a of the basic shelf 2100 to carry out the cross connect process and the protection switch process, and includes a line bridge 2231a and a line switch 2232a that are connected to the high-speed I/F cards 2210a and 2210b, a line bridge 2233a and a line switch 2234a that are connected to the high-speed I/F cards 2210c and 2210d, a line switch 2235a and a line bridge 2236a that are connected to the low-speed I/F cards 2220a and 2220b, and an optical array 2238a.

The optical array 2238a exchanges various kinds of signals between the switch card 2130a and the switch card 2230a via the optical transmission cable 2300a.

The switch card 2230b is a control card that requests the switch card 2130b of the basic shelf 2100 to carry out the cross connect process and the protection switch process, and includes a configuration similar to that of the switch card 2230a. While FIG. 10 does not depict the wiring of the switch card 2230b to avoid complexity of the drawing, the switch card 2230b is connected to the high-speed I/F cards 2210a to 2210d, and the low-speed I/F cards 2220a and 2220b, and is also connected to a switch card 2130b of the basic shelf 2100 via the optical transmission cable (not shown), like the switch card 2230a. To increase the availability, the switch cards 2230a and 2230b have a redundant configuration such that the switch card 2230a is used as the working system and the switch card 2230b is used as the standby system.

As explained above, the transmission device 2000 achieves very high reliability, by making the internal configuration redundant. Because the transmission device 2000 additionally includes the expansion shelf 2200 in the basic shelf 2100, the transmission device 2000 can achieve very high line-processing capacity. While FIG. 10 depicts the example of additionally providing only one expansion shelf 2200 in the basic shelf 2100, plural expansion shelves 2200 can be also additionally provided, when much higher line processing capacity is necessary.

In the transmission device 2000 shown in FIG. 10, the reference clock for the operation of the switch card 2230a of the expansion shelf 2200 is supplied from the switch card 2130a of the basic shelf 2100, and the reference clock for the operation of the switch card 2230b of the expansion shelf 2200 is supplied from the switch card 2130b of the basic shelf 2100.

When there is a difference between the length of the route through which the switch card 2130a supplies the reference clock to the switch card 2230a and the length of the route through which the switch card 2130b supplies the reference clock to the switch card 2230b, a phase difference (skew) occurs between the phase of the reference clock supplied to the switch card 2230a and the phase of the reference clock supplied to the switch card 2230b. This phase difference is also generated due to individual differences of various kinds of mounted parts and environmental factors such as temperature changes.

In the presence of a phase difference between the phase of the reference clock supplied to the current system and the phase of the reference clock supplied to the standby system, when the process is to be changed over from the working system to the standby system due to the occurrence of a trouble or due to an operational reason, a momentary disconnection of the line occurs. The SONET/SDH network is used in many cases as the backbone of a large-scale network, and high priority is set to reliability. Therefore, the occurrence of this momentary disconnection is a serious problem.

Figure 11:
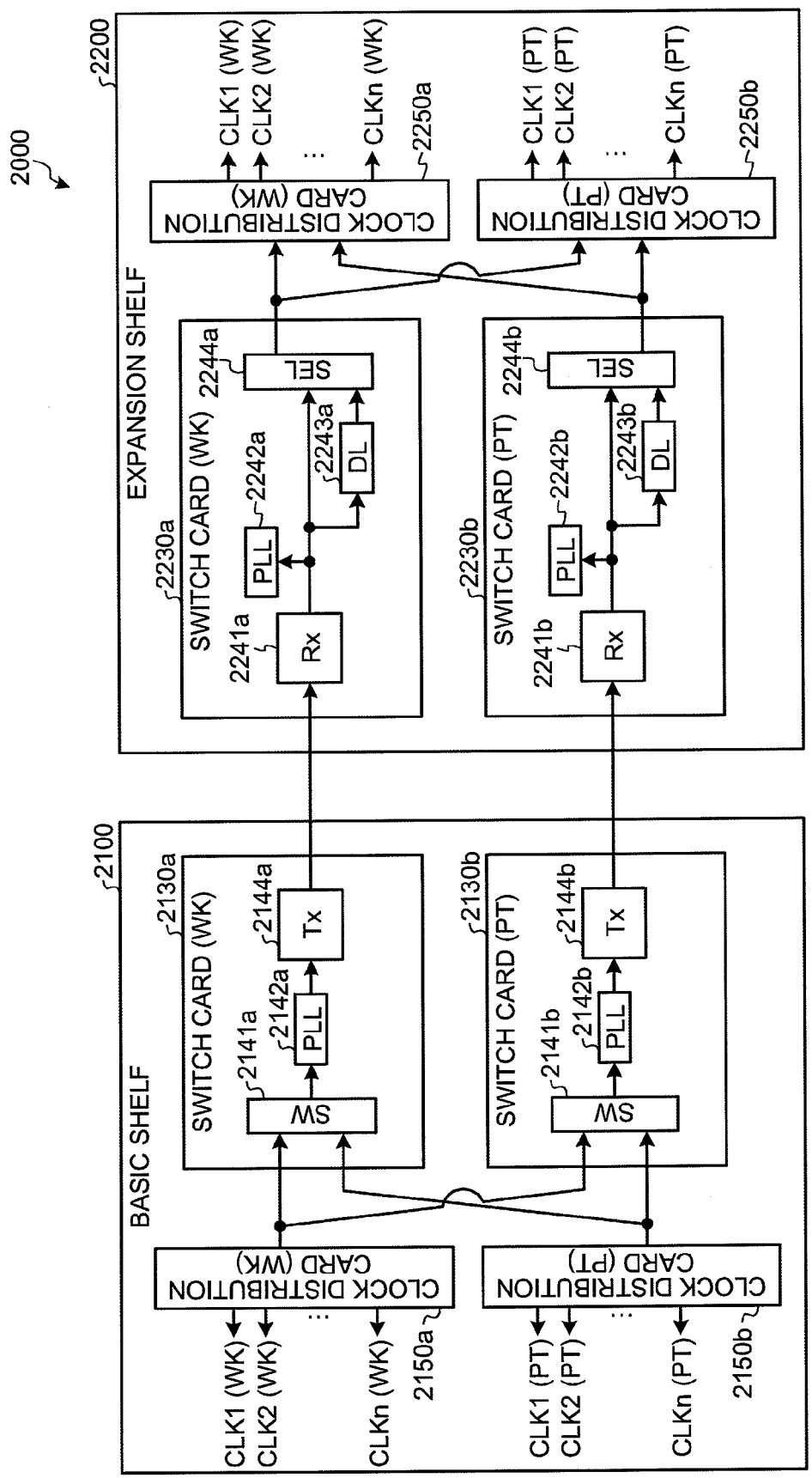
FIG. 11 is a block diagram for explaining a conventional phase control method.

A conventional method of correcting a phase difference between the phase of the reference clock supplied to the current system and the phase of the reference clock supplied to the standby system is explained next. FIG. 11 is a block diagram for explaining the conventional phase control method. FIG. 11 depicts a configuration of parts of the transmission device 2000 shown in FIG. 10 relevant to the transmission of the reference clock.

As shown in FIG. 11, the basic shelf 2100 is mounted with clock distribution cards 2150a and 2150b, in addition to the switch cards 2130a and 2130b. The clock distribution cards 2150a and 2150b generate reference clocks, and supply the reference clocks to various parts within the shelf. To increase the availability, the clock distribution cards have a redundant configuration such that the clock distribution card 2150a is used as the working system and the clock distribution card 2150b is used as the standby system.

The switch card 2130a includes a switch (SW) 2141a, a phase locked loop (PLL) circuit 2142a, and a transmitter (Tx) 2144a, to receive the reference clocks supplied from the clock distribution cards 2150a and 2150b and transmit the received reference clocks to the switch card 2230a.

The switch 2141a is a processor that outputs the reference clock supplied from the working system, to the PLL circuit 2142a, out of the clocks supplied from the clock distribution card 2150a or 2150b. The PLL circuit 2142a is a processor that stabilizes the reference clock, and a transmitter 2144a is a processor that transmits the reference clock stabilized by the PLL circuit 2142a to the switch card 2230a through the optical transmission cable 2300a.

The switch card 2130b has a configuration similar to that of the switch card 2130a, and includes a switch (SW) 2141b, a PLL circuit 2142b, and a transmitter (Tx) 2144b, to receive the reference clocks supplied from the clock distribution cards 2150a and 2150b and transmit the received reference clocks to the switch card 2230b.

The expansion shelf 2200 is mounted with clock distribution cards 2250a and 2250b, in addition to the switch cards 2230a and 2230b. The clock distribution cards 2250a and 2250b distribute the reference clock supplied from the switch card 2230a or 2230b, to various parts within the shelf. To increase the availability, the clock distribution cards have a redundant configuration such that the clock distribution card 2250a is used as the working system and the clock distribution card 2250b is used as the standby system.

The switch card 2230a includes a receiver (Rx) 2241a, a PLL circuit 2242a, a fixed delay circuit (DL: Delay Line) 2243a, and a selector (SEL) 2244a, to receive and use the reference clock supplied from the switch card 2130a.

The receiver 2241a is a processor that receives the reference clock supplied via the optical transmission cable 2300a. The PLL circuit 2242a is a processor that stabilizes the reference clock received by the receiver 2241a, to use the reference clock for various operations of the switch card 2230a.

The fixed delay circuit 2243a adds a fixed delay having a predetermined size to the reference clock received by the receiving unit 2241a. The selector 2244a is a processor that selects one of the reference clock received by the receiver 2241a and the reference clock added with a fixed delay by the fixed delay circuit 2243a, and supplies the selected reference clock to the clock distribution cards 2250a and 2250b.

The switch card 2230b has a configuration similar to that of the switch card 2230a, and includes a receiver (Rx) 2241b, a PLL circuit 2242b, a fixed delay circuit (DL) 2243b, and a selector (SEL) 2244b, to receive and use the reference clock supplied from the switch card 2130b.

As explained above, according to the conventional phase control method, there are provided the fixed delay circuits (for example, the fixed delay circuit 2243a and the fixed delay circuit 2243b) that add a fixed delay to the reference clock, and the selectors (for example, the selector 2244a and the selector 2244b) that selectively output one of the reference clock added with the fixed delay and the reference clock not added with the fixed delay. The selectors selectively change the selection corresponding to various conditions, thereby correcting the phase difference between the phases of the reference clocks.

While FIG. 11 depicts the provision of only one fixed delay circuit, there is also a configuration that plural fixed delay circuits having different delay amounts are provided, and the selectors select and output any one of the reference clock added with delays of different sizes by these fixed delay circuits and the reference clock not added with fixed delays.

The conventional method of correcting a phase difference between reference clocks by adding a fixed delay to a reference clock is valid to correct a stationary phase difference such as a phase difference generated due to a difference of positions of slots on which the cards are mounted. However, the conventional method cannot flexibly cope with the phase difference between the phases of the reference clocks generated due to various factors such as a tolerance of a cable length or individual differences of various kinds of mounted parts, and has a problem that a correctable range of the phase difference is limited.

Figure 1:
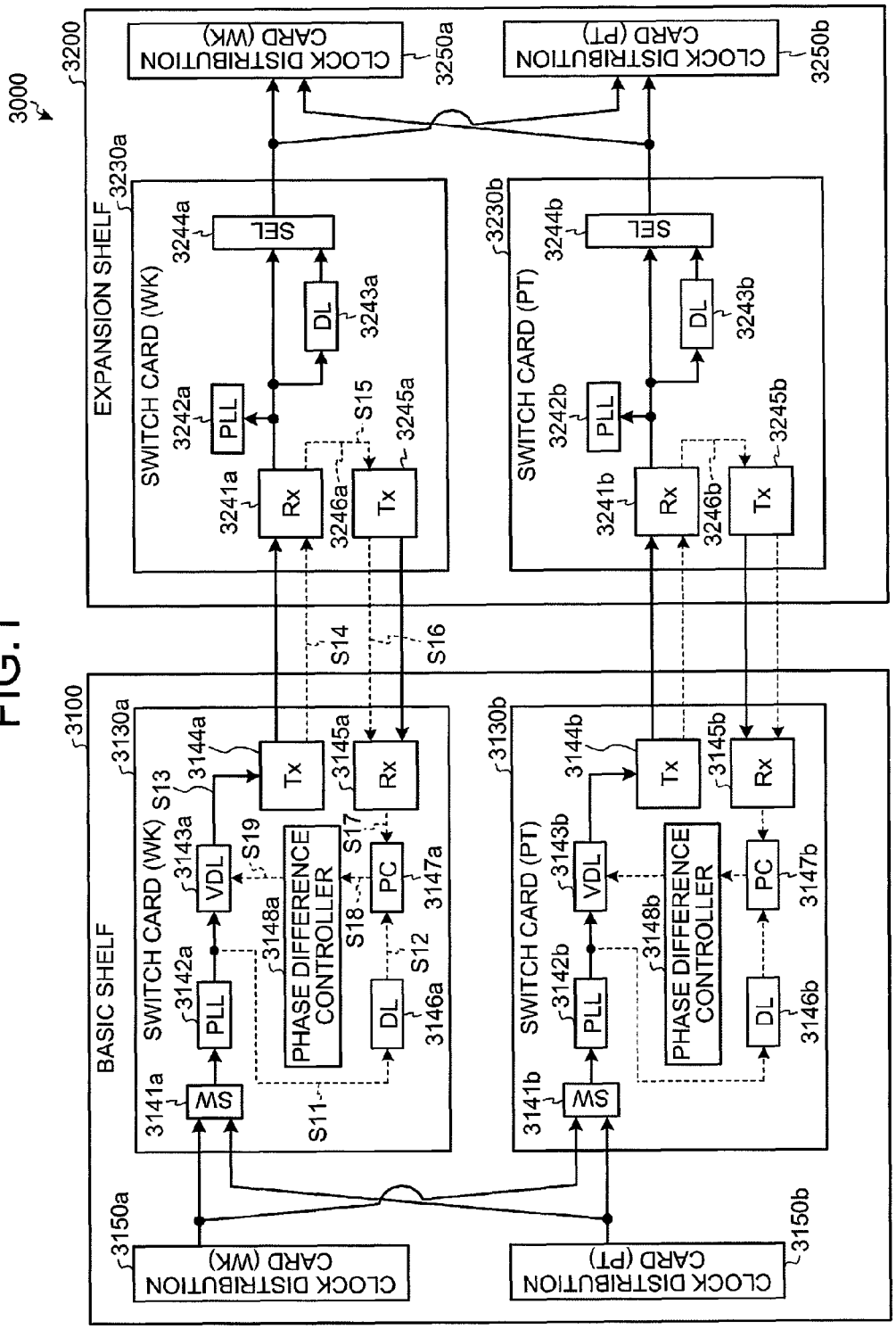
FIG. 1 is a block diagram for explaining a phase control method according to a first embodiment of the present invention.

A phase control method according to a first embodiment of the present invention is explained below. FIG. 1 is a block diagram for explaining the phase control method according to the first embodiment. FIG. 1 depicts a configuration of parts of a transmission device 3000 relevant to the transmission of reference clocks that executes the phase control method according to the first embodiment. The configuration of the transmission device 3000 that transmits a main signal is similar to that of the transmission device 2000.

As shown in FIG. 1, the transmission device 3000 includes a basic shelf 3100, and an expansion shelf 3200. To increase the line processing capacity, plural shelves having configurations similar to that of the expansion shelf 3200 can be connected to the basic shelf 3100. In this case, the phase control method according to the first embodiment is also valid.

The basic shelf 3100 is essential for the transmission device 3000 to operate, and is mounted with switch cards 3130a and 3130b, and clock distribution cards 3150a and 3150b. The clock distribution cards 3150a and 3150b generate reference clocks, and supply the reference clocks to various parts within the shelf. To increase the availability, the clock distribution cards have a redundant configuration such that the clock distribution card 3150a is used as the working system and the clock distribution card 3150b is used as the standby system.

The switch card 3130a carries out the cross connect process and the protection switch process, receives reference clocks supplied from the clock distribution cards 3150a and 3150b, and transmits the received reference clocks to a switch card 3230a.

The switch card 3130a includes a switch (SW) 3141a, a PLL circuit 3142a, a variable delay circuit (VDL: Variable Delay Line) 3143a, a transmitter (Tx) 3144a, a receiver (Rx) 3145a, a fixed delay circuit 3146a, a phase comparator (PC: Phase Comparator) 3147a, and a phase difference controller 3148a, to receive the reference clocks supplied from the clock distribution cards 3150a and 3150b, and transmit these reference clocks to the switch card 3230a.

The switch 3141a is a processor that outputs the reference clock supplied from the working system, to the PLL circuit 3142a, out of the clocks supplied from the clock distribution card 3150a or 3150b. The PLL circuit 3142a is a processor that stabilizes the reference clock.

The variable delay circuit 3143a is a processor that adds a delay to the reference clock stabilized by the PLL circuit 3142a. The variable delay circuit 3143a changes the delay amount added to the reference clock within a fixed range of width, following the control of the phase difference controller 3148a. The transmitter 3144a is a processor that transmits the reference clock added with the delay by the variable delay circuit 3143a, to the switch card 3230a.

The receiver 3145a is a processor that receives the reference clock returned from the switch card 3230a, and outputs the received reference clock to the phase comparator 3147a. The transmission device 3000 includes a route through which the reference clock supplied from the switch card 3130a to the switch card 3230a is returned to the switch card 3130a. The receiver 3145a receives the reference clock returned through this route.

The fixed delay circuit 3146a is a processor that generates a comparison reference clock by adding a fixed delay having a predetermined size to the reference clock stabilized by the PLL circuit 2142a, and outputs the generated comparison reference clock to the phase comparator 3147a. The fixed delay circuits of all switch cards of the basic shelf 3100 are supplied with the reference clocks from the same clock distribution cards through a sufficiently short route, and add a fixed delay of the same size to the supplied reference clocks. Therefore, the comparison reference clocks generated by all the fixed delay circuits have the same phases.

The phase comparator 3147a is a processor that calculates a phase difference between the phase of the reference clock supplied from the receiver 3145a and the phase of the comparison reference clock supplied from the fixed delay circuit 3146a, and notifies a result of the calculation to the phase difference controller 3148a.

The phase difference controller 3148a carries out various kinds of control to perform the phase control, and controls a delay amount that the variable delay circuit 3143a gives to the reference clock, based on a result of calculating the phase difference notified from the phase comparator 3147a. Specifically, the phase difference controller controls the delay amount so that the phase of the reference clock returned from the switch card 3230a and supplied from the receiver 3145a coincides with the phase of the comparison reference clock.

The switch card 3130b has a configuration similar to that of the switch card 3130a, and includes a switch (SW) 3141b, a PLL circuit 3142b, a variable delay circuit (VDL) 3143b, a transmitter (Tx) 3144b, a receiver (Rx) 3145b, a fixed delay circuit 3146b, a phase comparator (PC) 3147b, and a phase difference controller 3148b, to receive the reference clocks supplied from the clock distribution cards 3150a and 3150b, and transmit these reference clocks to the switch card 3230b.

The expansion shelf 3200 is additionally provided to increase the line accommodation capacity and the like of the transmission device 3000, and is mounted with the switch cards 3230a and 3230b, and clock distribution cards 3250a and 3250b. The clock distribution cards 3250a and 3250b distribute the reference clock supplied from the switch card 3230a or 3230b to various parts within the shelf. To increase the availability, the clock distribution cards have a redundant configuration such that the clock distribution card 3250a is used as the working system and the clock distribution card 3250b is used as the standby system.

The switch card 3230a is a processor that requests the switch card 3130a to carry out the cross connect process and the protection switch process, receives the reference clock supplied from the switch card 3130a, and transmits the received reference clock to the clock distribution cards 3250a and 3250b. The switch card 3230a returns the reference clock supplied from the switch card 3130a to the switch card 3130a to carry out the phase control.

The switch card 3230a includes a receiver (Rx) 3241a, a PLL circuit 3242a, a fixed delay circuit (DL) 3243a, a selector (SEL) 3244a, a transmitter (Tx) 3245a, and a return route 3246a, to receive and transmit the reference clock.

The receiver 3241a to the selector 3244a are identical to the receiver 2241a to the selector 2244a shown in FIG. 11, and therefore explanations thereof will be omitted. The return route 3246a is used to transmit the reference clock received by the receiver 3241a to the transmitter 3245a in return. The transmitter 3245a is a processor that transmits the reference clock transmitted through the return route 3246a, to the receiver 3145a of the switch card 3130a.

The switch card 3230b has a configuration similar to that of the switch card 3230a, and receives the reference clock supplied from the switch card 3130b, transmits the received reference clock to the clock distribution cards 3250a and 3250b. The switch card 3230b returns the reference clock supplied from the switch card 3130b to the switch card 3130b to carry out the phase control. The switch card 3230b includes a receiver (Rx) 3241b, a PLL circuit 3242b, a fixed delay circuit (DL) 3243b, a selector (SEL) 3244b, a transmitter (Tx) 3245b, and a return route 3246b, to receive and transmit the reference clock.

The process of the phase control method carried out by the transmission device 3000 shown in FIG. 1 is explained next. It is assumed that the clock distribution card 3150a is the current system, and the reference clock is supplied to the switch cards 3130a and 3130b.

The clock distribution card 3150a generates a reference clock, and transmits this reference clock to the switch cards 3130a and 3130b. The switch 3141a in the switch card 3130a receives the reference clock, and the PLL circuit 3142a outputs a signal, and inputs the signal to the fixed delay circuit 3146a (step S11). The fixed delay circuit 3146a adds a delay of a fixed amount to the signal, and outputs the signal to the phase comparator 3147a (step S12).

On the other hand, the signal output from the PLL circuit 3142a is also input to the variable delay circuit 3143a, is added with a delay of a predetermined size, and is output to the transmitter 3144a (step S13). At this stage, the phase difference controller 3148a controls the variable delay circuit 3143a to add a delay amount of a predetermined size to the signal.

The signal input to the transmitter 3144a is transmitted to the receiver 3241a of the switch card 3230a through the optical transmission cable (step S14), and is transmitted to the transmitter 3245a through the return route 3246a (step S15). The signal is then transmitted to the receiver 3145a of the switch card 3130a through the optical transmission cable (step S16), and is output to the phase comparator 3147a (step S17).

In parallel with the above operation, the switch card 3130b carries out a similar operation, and the phase comparator 3147b receives the signal added with a delay of a fixed amount by the fixed delay circuit 3146b and the signal returned from the switch card 3230b.

FIG. 2A is an example of signals that the phase comparators 3147a and 3147b receive at this stage. In the switch card 3130a, the fixed delay circuit 3146a adds a delay amount 11 to a signal 21a output from the PLL circuit 3142a to form a signal 22a, and the phase comparator 3147a receives the signal 22a.

The switch card 3230a returns the signal output from the PLL circuit 3142a, and the receiver 3145a outputs a signal 23a. The signal 23a is slightly delayed in the transmission process, and the phase comparator 3147a receives this delayed output signal 23a. When the signal 22a and the signal 23a reach the phase comparator 3147a, a phase difference 12 is generated between these signals.

On the other hand, in the switch card 3130b, the PLL circuit 3142b outputs a signal 21b at the same timing as when the PLL circuit 3142a outputs the signal 21a. The switch card 3130a and the switch card 3130b have the same designs. Because the route from the clock distribution card 3150a to the PLL circuit 3142a and the route from the clock distribution card 3150a to the PLL circuit 3142b are sufficiently short, the signal 21a and the signal 21b have the same phases.

The fixed delay circuit 3146b adds the delay amount 11 to the signal 21b to form a signal 22b, and the phase comparator 3147b receives the signal 22b. Because the delay amount that the fixed delay circuit 3146a adds and the delay amount that the fixed delay circuit 3146b adds are the same delay amount 11, the signal 22a and the signal 22b have the same phases.

The switch card 3230b returns the signal output from the PLL circuit 3142b, and the receiver 3145b outputs a signal 23b. The signal 23b is slightly delayed in the transmission process, and the phase comparator 3147b receives this delayed output signal 23b. When the signal 22b and the signal 23b reach the phase comparator 3147b, a phase difference 13 is generated between these signals.

In comparing the signal 23a with the signal 23b, there is a phase difference of a delay size generated in the transmission process. This phase difference is generated due to a difference between the length of a cable connecting between the switch card 3130a and the switch card 3230a and the length of a cable connecting between the switch card 3130b and the switch card 3230b. While the cables of the same standard are used for the connection between the switch cards, the cable length has a tolerance, and this tolerance generates the phase difference.

The phase comparator 3147a receives the signal from the fixed delay circuit 3146a and the signal from the receiver 3145a, compares the phases of both received signals, and notifies a result of the comparison to the phase difference controller 3148a (step S18). The phase difference controller 3148a controls the delay amount that the variable delay circuit 3143a adds, so that the signal from the receiver 3145a has the same phase as that of the signal from the fixed delay circuit 3146a (step S19).

By carrying out the above series of operation or by repeating the series of operation at several times, the phase comparator 3147a can compare the phase of the signal received from the fixed delay circuit 3146a with the phase of the signal received from the receiver 3145a, thereby making the phases coincide with each other. In the switch card 3130b, a similar operation is also carried out, and the phase comparator 3147b can compare the phase of the signal received from the fixed delay circuit 3146b with the phase of the signal received from the receiver 3145b, thereby making the phases coincide with each other.

Figure 2B:
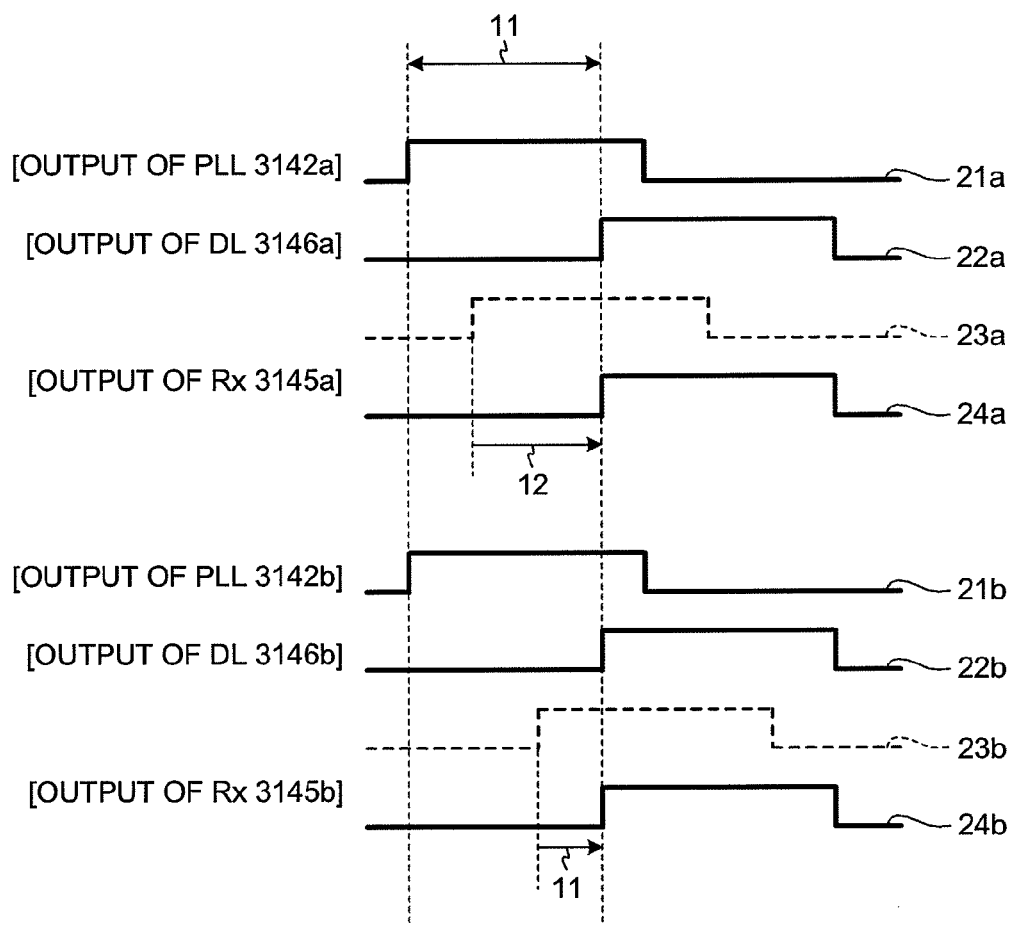
FIG. 2B is a timing chart of an operation after correcting a phase difference.

FIG. 2B is an example of signals that the phase comparators 3147a and 3147b receive at this stage. In the switch card 3130a, the fixed delay circuit 3146a adds the delay amount 11 to the signal 21a output from the PLL circuit 3142a to form the signal 22a, and the phase comparator 3147a receives the signal 22a.

The switch card 3230a returns the signal output from the PLL circuit 3142a, and the receiver 3145a outputs a signal 24a. The signal 24a is delayed in the transmission process, and the variable delay circuit 3143a also adds a delay amount corresponding to the phase difference 12 to the signal 24a. The phase comparator 3147a receives this delayed output signal 24a. Based on the delay added to the signal 24a by the variable delay circuit 3143a, there is no phase difference between the phase of the signal 22a and the phase of the signal 24a.

Similarly, in the switch card 3130b, the variable delay circuit 3143b adds a delay amount corresponding to the phase difference 13 to a signal 24b, and there is no phase difference between the phase of the signal 22b output from the fixed delay circuit 3146b and the phase of the signal 24b output from the receiver 3145b.

Because the signal 22a and the signal 22b have the same phases as explained above, there is no difference between the phase of the signal 22a and the phase of the signal 22b. Therefore, the signal 24a transmitted from the switch card 3130a to the switch card 3230a and returned to the switch card 3130a has the same phase as that of the signal 24b transmitted from the switch card 3130b to the switch card 3230b and returned to the switch card 3130b. As a result, the phase of the reference clock of the working system is synchronized with the phase of the reference clock of the standby system.

The above series of operation are not necessary to be always executed during the operation of the transmission device 3000. It can be arranged such that the above operation is executed during a period while the transmission device 3000 is initialized, thereby synchronizing the phase of the reference clock of the working system with the phase of the reference clock of the standby system. Thereafter, the variable delay circuit 3143a and the variable delay circuit 3143b can continuously add respectively assigned constant delay amounts to the reference clocks.

Configurations of the phase comparator 3147a and the phase comparator 3148a shown in FIG. 1 are explained below. The phase comparator 3147b shown in FIG. 1 has a configuration similar to that of the phase comparator 3147a, and the phase difference controller 3148b has a configuration similar to that of the phase difference controller 3148a.

Figure 3:
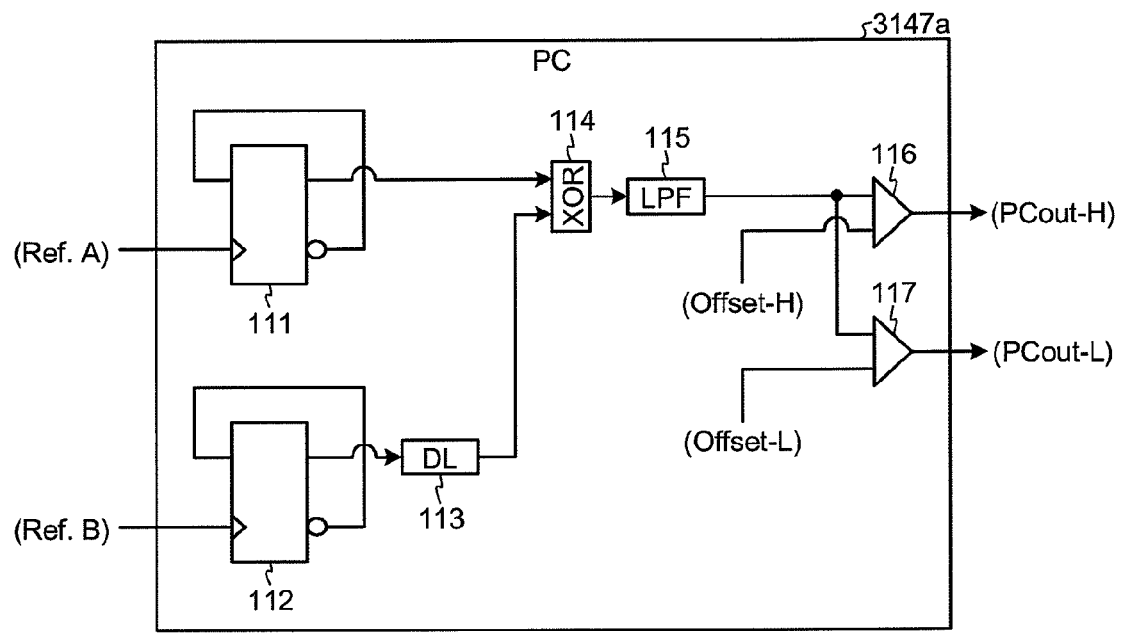
FIG. 3 is a block diagram of a configuration of a phase comparator.

FIG. 3 is a block diagram of the configuration of the phase comparator 3147a. As shown in FIG. 3, the phase comparator 3147a is a circuit that receives two reference clocks including Ref.A corresponding to the output of the fixed delay circuit 3146a and Ref.B corresponding to the output of the receiver 3145a, and outputs a PCout-H signal and a PCout-L signal as a result of comparing the two reference clocks. The phase comparator 3147a includes a ½ dividing circuit 111, a ½ dividing circuit 112, a fixed delay circuit 113, an exclusive OR (XOR) circuit 114, a loop filter (LPF) 115, a bias voltage comparator 116, and a bias voltage comparator 117.

The ½ dividing circuit 111 divides the Ref.A by half, and the ½ dividing circuit 112 divides the Ref.B by half. The fixed delay circuit 113 adds a delay of $\pi/2$ to the signal divided by half by the ½ dividing circuit 112. The XOR circuit 114 calculates an exclusive OR of the signal output from the ½ dividing circuit 111 and the signal output from the fixed delay circuit 113.

The loop filter 115 is a circuit that smoothes the signal output from the XOR circuit 114. The bias voltage comparator 116 is a circuit that compares the voltage value of the signal output from the loop filter 115 with Offset-H as an upper-limit voltage value of the lock area, and that turns on the PCout-H signal when the voltage value of the signal output from the loop filter 115 is higher. The bias voltage comparator 117 is a circuit that compares the voltage value of the signal output from the loop filter 115 with Offset-L as a lower-limit voltage value of the lock area, and that turns on the PCout-L signal when the voltage value of the signal output from the loop filter 115 is lower.

The operation of the phase comparator 3147a is explained based on a specific example. FIG. 4A depicts the operation when the Ref.B is delayed from the Ref.A. As shown in FIG. 4A, the ½ dividing circuit 111 divides the input Ref.A (signal 41a) by half, and generates a signal 42a.

Similarly, the ½ dividing circuit 112 divides the input Ref.B (signal 41b) by half, and generates a signal 42b. The fixed delay circuit 113 adds a delay amount 31 of $\pi/2$ to the signal 42b, thereby generating a signal 43a.

The XOR circuit 114 calculates an exclusive OR of the signal 42a and the signal 43b, and generates a signal 44. When the Ref.B is delayed from the Ref.A, the signal 44 has a long state of high, as shown in FIG. 4A, and a signal 45 output from the loop filter 115 has a higher voltage than that of a lock area 46. As a result, when the Ref.B is delayed from the Ref.A, the PCout-H becomes on.

On the other hand, when the Ref.B is more advanced from the Ref.A, the signal 44 has a long state of low, and the signal 45 output from the loop filter 115 keeps a voltage lower than that of the lock area 46, as shown in FIG. 4B. As a result, when the Ref.B is more advanced from the Ref.A, the PCout-L signal is turned on.

When the Ref.B is synchronized with the Ref.A, the signal 44 has substantially a balanced state of the length of the high state and the length of the low state, and the signal 45 output from the loop filter 115 is accommodated within the lock area 46, as shown in FIG. 4C. As a result, when the Ref.B and the Ref.A are synchronized, both the PCout-H signal and the PCout-L signal are turned off.

Figure 5:
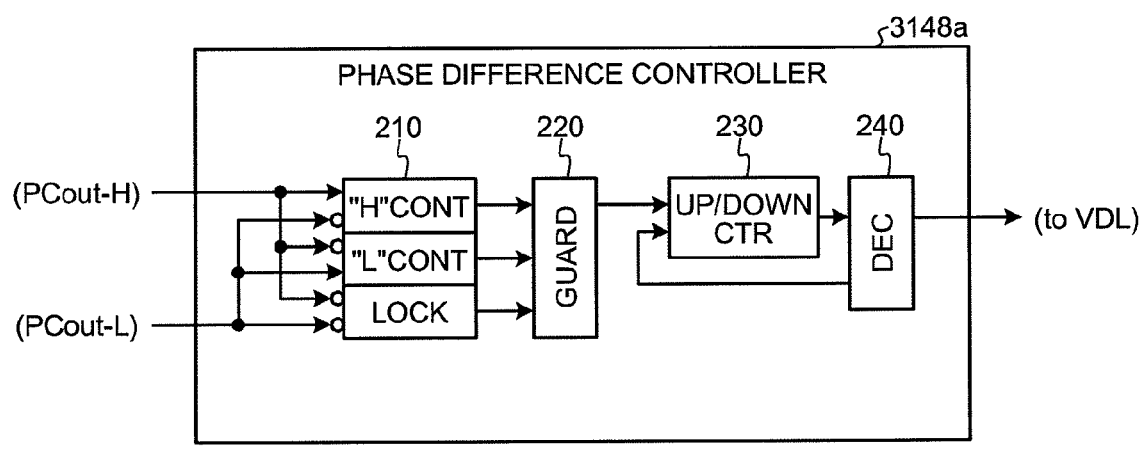
FIG. 5 is a block diagram of a configuration of a phase difference controller.

FIG. 5 is a block diagram of the configuration of the phase difference controller 3148a. As shown in FIG. 5, the phase difference controller 3148a includes a phase-correction determining circuit 210, a protection circuit (Guard) 220, an up/down counter (Up/Down CTR) 230, and a decoder (DEC) 240.

The phase-correction determining circuit 210 includes three control flags of an "H" cont, an "L" cont, and a Lock. The "H" cont is a control flag which stands when the PCout-H signal is on, and this flag indicates that the phase of the Ref.B needs to be advanced. The "L" cont is a control flag which stands when the PCout-L signal is on, and this flag indicates that the phase of the Ref.B needs to be delayed. The Lock is a control flag which stands when the PCout-H signal and the PCout-L signal are off, and this flag indicates that the Ref.B and the Ref.A are synchronized.

The protection circuit 220 confirms that the state of each control flag of the phase-correction determining circuit 210 does not change for a constant time to avoid variation in the control of the variable delay circuit 3143a, and thereafter notifies the up/down counter 230 about the state of each control flag. The up/down counter 230 is a circuit that outputs a signal indicating whether the control in the last control direction is to be increased or decreased or the control is to be stopped, based on the notification from the protection circuit 220. The decoder 240 is a circuit that converts the output of the up/down counter 230 into a signal for controlling the variable delay circuit 3143a.

As explained above, the phase difference controller 3148a is a circuit that receives the PCout-H signal and the PCout-L signal, and outputs a signal for controlling the variable delay circuit 3143a based on these signals.

As described above, according to the phase control method of the first embodiment, the supplier of the reference clock compares the reference clock returned from the supply destination with the comparison reference clock of which phase coincides in all suppliers, and adjusts a delay amount to be added to the reference clock so that the phase of the reference clock coincides with the phase of the comparison reference clock. Therefore, it is possible to correct a phase difference between the phase of the reference clock supplied from the supplier to the supply destination in the working system and the phase of the reference clock supplied from the supplier to the supply destination in the standby system, thereby making the phases coincide with each other.

According to the phase control method of the first embodiment, the reference clock once transmitted to the supply destination is returned to the supplier, and a phase difference between the reference clocks is corrected using one of the reference clocks as the comparison reference clock. Therefore, a phase difference attributable to the individual differences of various parts on the route through which the reference clock is transmitted is corrected in high precision. According to the phase control method of the first embodiment, because the phase difference is corrected using the variable delay circuit, a phase difference generated due to various factors can be flexibly coped with.

According to the phase control method of the first embodiment, there is no processing of comparing between the reference clock in the working system and the reference clock in the standby system, and the working system and the standby system can independently operate to execute the phase control. Therefore, the systems can be operated flexibly.

For example, when the configuration of the standby system is added in the state where only the working system is operating, the phase of the reference clock of the working system can be synchronized with the phase of the reference clock of the standby system without stopping the working system. A phase difference between the phases of the reference clocks can be easily corrected when the information processing apparatus includes a triplicate redundant configuration to increase the availability, instead of the duplex redundant configuration of the working system and the standby system.

The first embodiment represents an example that the fixed delay circuit 3146a adds a fixed delay to the reference clock output from the PLL circuit 3142a to generate a comparison reference clock. The comparison reference clock is sufficient when the phases coincide in all switch cards that become the reference clock suppliers, and other unit can generate the comparison reference clock.

Figure 6:
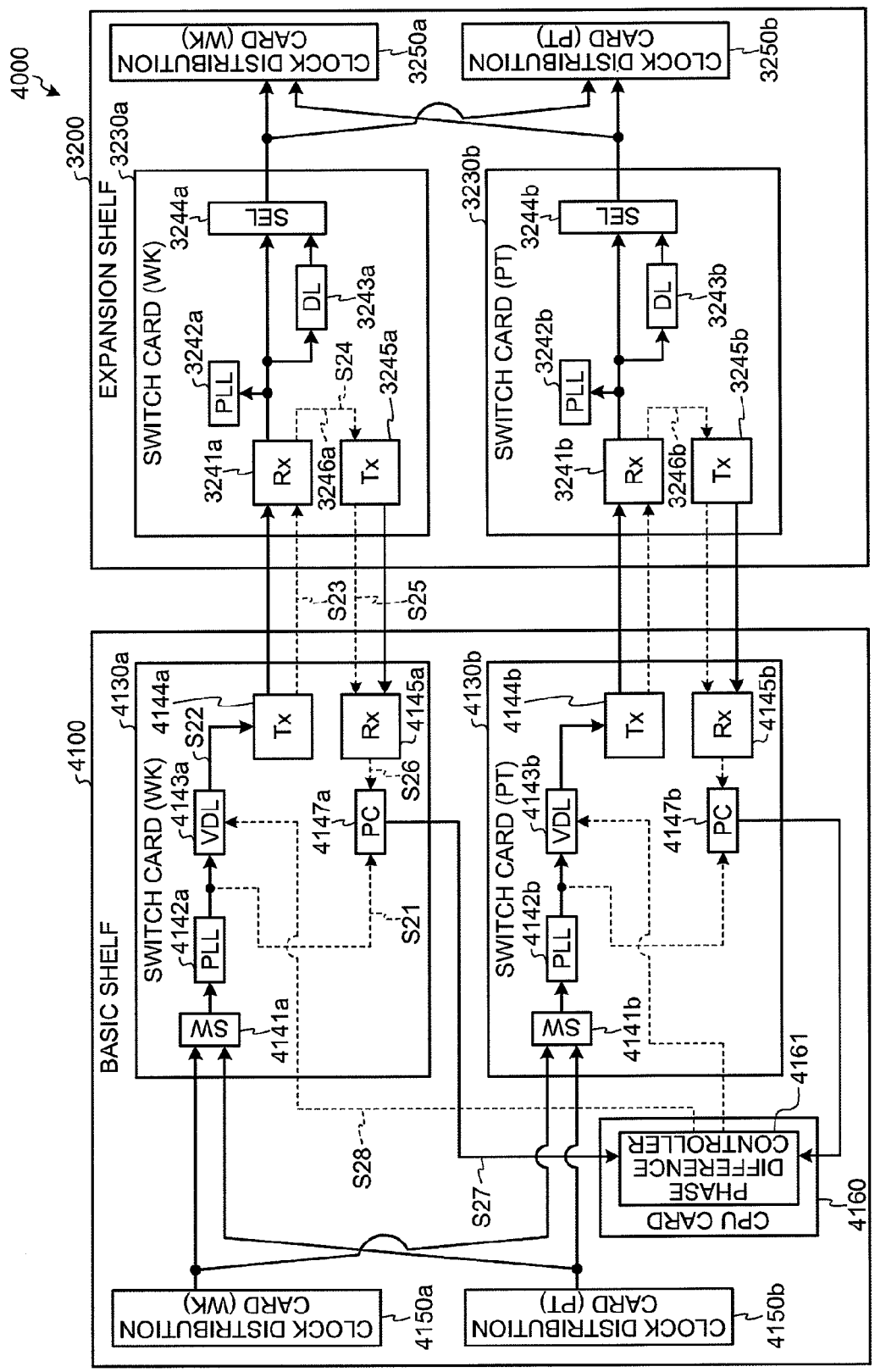
FIG. 6 is a block diagram for explaining a phase control method according to a second embodiment of the present invention.

In a second embodiment of the present invention, there is explained a method of synchronizing the reference clock of the working system with the reference clock of the standby system by comparing the delay amount of the reference clock in the working system with the delay amount of the reference clock in the standby system. FIG. 6 is a block diagram for explaining the phase control method according to the second embodiment. FIG. 6 depicts a configuration of parts of a transmission device 4000 relevant to the transmission of the reference clock that executes the phase control method according to the second embodiment. The configuration of the transmission device 4000 that transmits a main signal is similar to that of the transmission device 2000.

As shown in FIG. 6, the transmission device 4000 includes a basic shelf 4100 and an expansion shelf 3200. The expansion shelf 3200 is similar to that shown in FIG. 1. To increase the line processing capacity, plural shelves having a configuration similar to that of the expansion shelf 3200 can be connected to the basic shelf 4100. In this case, the phase control method according to the second embodiment is also valid.

The basic shelf 4100 is essential for the transmission device 4000 to operate, and includes switch cards 4130a and 4130b, clock distribution cards 4150a and 4150b, and a central processing unit (CPU) card 4160. The clock distribution cards 4150a and 4150b generate reference clocks, and supply the reference clocks to various parts within the shelf. To increase the availability, the switch cards 4130a and 4130b have a redundant configuration such that the switch card 4130a is used as the working system and the switch card 4130b is used as the standby system.

The switch card 4130a carries out the cross connect process and the protection switch process, receives reference clocks supplied from the clock distribution cards 4150a and 4150b, and transmits the received reference clocks to a switch card 3230a.

The switch card 4130a includes a switch (SW) 4141a, a PLL circuit 4142a, a variable delay circuit (VDL) 4143a, a transmitter (Tx) 4144a, a receiver (Rx) 4145a, and a phase comparator (PC) 4147a, to receive the reference clocks supplied from the clock distribution cards 4150a and 4150b, and transmit these reference clocks to the switch card 3230a.

The switch 4141a is a processor that outputs the reference clock supplied from the working system, to the PLL circuit 4142a, out of the clocks supplied from the clock distribution card 4150a or 4150b. The PLL circuit 4142a is a processor that stabilizes the reference clock.

The variable delay circuit 4143a is a processor that adds a delay to the reference clock stabilized by the PLL circuit 4142a. The variable delay circuit 4143a changes the delay amount added to the reference clock within a fixed range of width, following the control of a phase difference controller 4161 of the CPU card 4160. The transmitter 4144a is a processor that transmits the reference clock added with the delay by the variable delay circuit 4143a, to the switch card 3230a.

The receiver 4145a is a processor that receives the reference clock returned from the switch card 3230a, and outputs the received reference clock to the phase comparator 4147a. The phase comparator 4147a is a processor that calculates a phase difference between the phase of the reference clock supplied from the receiver 4145*a* and the phase of the reference clock supplied from the PLL circuit 4142*a*, and notifies a result of the calculation to the phase difference controller 4161.

The switch card 4130*b* has a configuration similar to that of the switch card 4130*a*, and includes a switch (SW) 4141*b*, a PLL circuit 4142*b*, a variable delay circuit (VDL) 4143*b*, a transmitter (Tx) 4144*b*, a receiver (Rx) 4145*b*, and a phase comparator (PC) 3147*b*, to receive the reference clocks supplied from the clock distribution cards 4150*a* and 4150*b*, and transmit these reference clocks to the switch card 3230*b*.

The CPU card 4160 executes various kinds of control by executing software, and has a phase difference controller 4161. The phase difference controller 4161 carries out various kinds of control to perform the phase control, understands a phase difference between the phase of the reference clock of the working system and the phase of the reference clock of the standby system and corrects the phase difference, based on the information notified from the phase comparator 4147*a* and the phase comparator 4147*b*.

The process of the phase control method carried out by the transmission device 4000 shown in FIG. 6 is explained next. It is assumed that the clock distribution card 4150*a* is the current system, and the reference clock is supplied to the switch cards 4130*a* and 4130*b*.

The clock distribution card 4150*a* generates a reference clock, and transmits this reference clock to the switch cards 4130*a* and 4130*b*. The switch 4141*a* in the switch card 4130*a* receives the reference clock, the PLL circuit 4142*a* stabilizes this signal and outputs the signal to the phase comparator 4147*a* (step S21).

On the other hand, the signal output from the PLL circuit 4142*a* is also input to the variable delay circuit 4143*a*, is added with a delay of a predetermined size, and is output to the transmitter 4144*a* (step S22). At this stage, the phase difference controller 4161 controls the variable delay circuit 4143*a* to add a delay amount of a predetermined size to the signal.

The signal input to the transmitter 4144*a* is transmitted to the receiver 3241*a* of the switch card 3230*a* through the optical transmission cable (step S23), and is transmitted to the transmitter 3245*a* through the return route 3246*a* (step S24). The signal is then transmitted to the receiver 4145*a* of the switch card 4130*a* through the optical transmission cable (step S25), and is output to the phase comparator 4147*a* (step S26).

In parallel with the above operation, the switch card 4130*b* carries out a similar operation, and the phase comparator 4147*b* receives the signal output from the PLL circuit 4142*b* and the signal returned from the switch card 3230*b*.

Figure 7A:
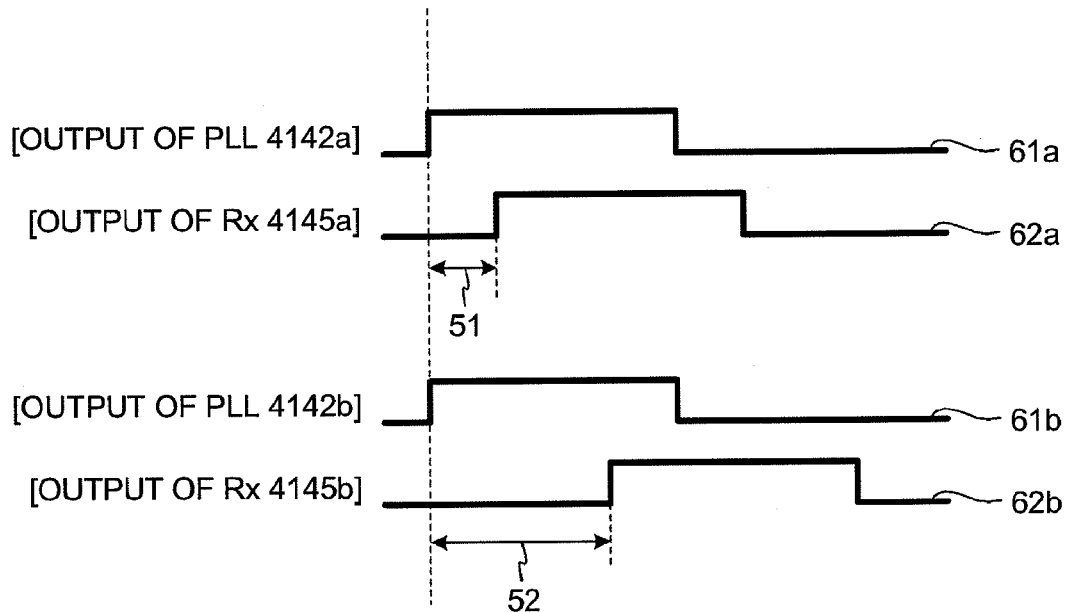
FIG. 7A is a timing chart of an operation before correcting a phase difference.

FIG. 7A is an example of signals that the phase comparators 4147*a* and 4147*b* receive at this stage. In the switch card 4130*a*, the phase comparator 4147*a* receives a signal 61*a* output from the PLL circuit 4142*a*. A signal 62*a* is output from the PLL circuit 4142*a* and is returned from the switch card 3230*a*. The receiver 4145*a* outputs the signal 62*a*. This signal is slightly delayed in the transmission process, and the phase comparator 4147*a* receives this signal. When the signal 61*a* and the signal 62*a* reach the phase comparator 4147*a*, a phase difference 51 is generated between these signals.

On the other hand, in the switch card 4130*b*, the PLL circuit 4142*b* outputs a signal 61*b* at the same timing as when the PLL circuit 4142*a* outputs the signal 61*a*. The phase comparator 4147*b* receives the signal 61*b*. The switch card 4130*a* and the switch card 4130*b* have the same designs. Because the route from the clock distribution card 4150*a* to the PLL circuit 4142*a* and the route from the clock distribution card 4150*a* to the PLL circuit 4142*b* are sufficiently short, the signal 61*a* and the signal 61*b* have the same phases.

The switch card 3230*b* returns the signal output from the PLL circuit 3142*b*, and the receiver 4145*b* outputs a signal 62*b*. The signal 62*b* is slightly delayed in the transmission process, and the phase comparator 4147*b* receives this delayed output signal 62*b*. When the signal 61*b* and the signal 61*b* reach the phase comparator 4147*b*, a phase difference 52 is generated between these signals.

In comparing the signal 62*a* with the signal 62*b*, there is a phase difference of a delay size generated in the transmission process. This phase difference is generated due to a difference between the length of a cable connecting between the switch card 4130*a* and the switch card 4230*a* and the length of a cable connecting between the switch card 4130*b* and the switch card 4230*b*.

The phase comparator 4147*a* receives the signal from the PLL circuit 4142*a* and the signal from the receiver 4145*a*, compares the phases of both received signals, and notifies a phase difference to the phase difference controller 4161 (step S27). The phase difference controller 4161 also receives the notification of the phase difference from the phase comparator 4147*b*, and instructs the variable delay circuit at the smaller phase-difference side to delay the phase by this phase difference (step S28).

By carrying out the above series of operation or by repeating the series of operation at several times, the phase difference detected by the phase comparator 4147*a* and the phase difference detected by the phase comparator 4147*b* coincide with each other, and the reference clock supplied from the switch card 4130*a* to the switch card 3230*a* and the reference clock supplied from the switch card 4130*b* to the switch card 3230*b* can be synchronized.

Figure 7B:
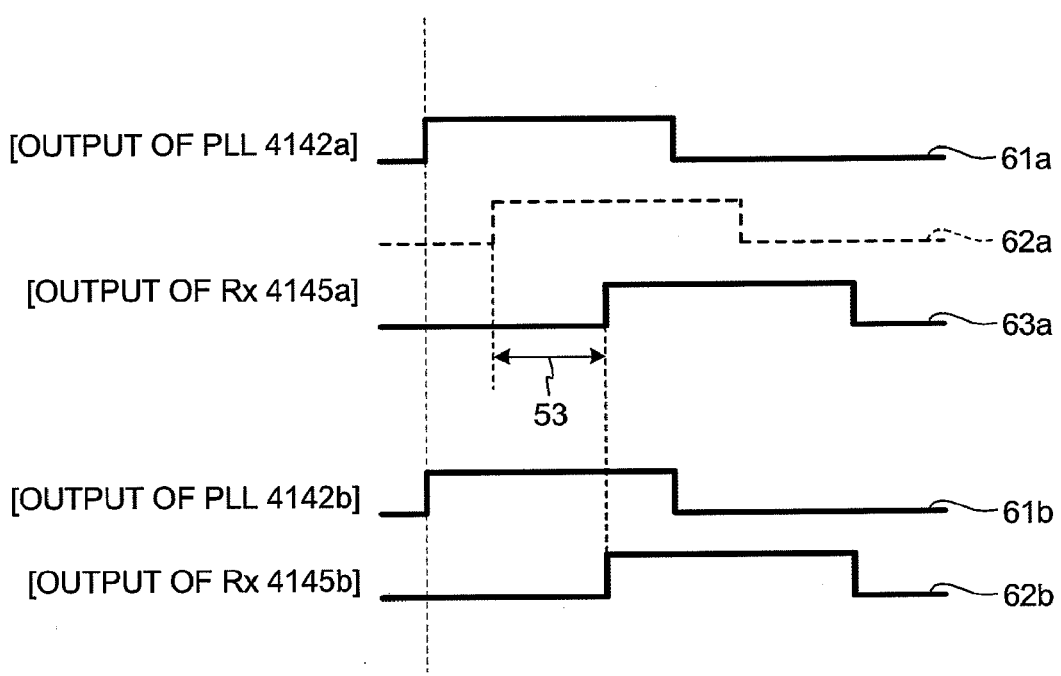
FIG. 7B is a timing chart of an operation after correcting a phase difference.

FIG. 7B is an example of signals that the phase comparators 4147*a* and 4147*b* receive at this stage. In the example shown in FIG. 7A, the phase difference 51 of the signal 62*a* is smaller than the phase difference 52 of the signal 62*b*. Therefore, the phase difference controller 4161 instructs the variable delay circuit 4143*a* to delay the phase by the difference between the phase difference 52 and the phase difference 51. As a result, a delay amount 53 is added to the signal 62*a* to form a signal 63*a* having the same phase as that of the signal 62*b*, thereby achieving the phase synchronization between the working system and the standby system.

The above series of operation are not necessary to be always executed during the operation of the transmission device 4000. It can be arranged such that the above operation is executed during a period while the transmission device 4000 is initialized, thereby synchronizing the phase of the reference clock of the working system with the phase of the reference clock of the standby system. Thereafter, the variable delay circuit 4143*a* and the variable delay circuit 4143*b* can continuously add respectively assigned constant delay amounts to the reference clocks.

In carrying out the above phase control in the middle of the execution of the communication control of the transmission device 4000, the variable delay circuit of the standby system changes only the delay amount to be added to the reference clock to carry out the phase control, instead that the variable delay circuit of the working system changes the delay amount to be added to the reference clock. Therefore, the phase of the reference clock of the working system can be synchronized with the phase of the reference clock of the standby system, without affecting the communication control executed in the working system.

As described above, in the second embodiment, the phase difference controller 4161 of the CPU card 4160 provided independently of the switch card obtains the phase difference between the phase of the reference clock returned from the supply destination and the phase of the reference clock before it is returned. Based on this information, the phase difference controller 4161 adjusts the delay amount to be added to the reference clock supplied to the supply destination. Therefore, it is possible to correct the phase difference between the phase of the reference clock supplied from the supplier to the supply destination in the working system and the phase of the reference clock supplied from the supplier to the supply destination in the standby system, thereby making the phases coincide with each other.

In the phase control method according to the second embodiment, the reference clock once transmitted to the supply destination is returned to the supplier, and the phase difference is corrected using the returned reference clock. Therefore, the phase difference attributable to the individual differences of various kinds of parts on the route through which the reference clock is transmitted can be corrected in high precision. According to the phase control method of the second embodiment, because the phase difference is corrected using the variable delay circuit, a phase difference generated due to various factors can be flexibly coped with.

According to the phase control method of the second embodiment, the CPU card 4160 independent of the working system and the standby system executes the phase control. Therefore, the execution timing of the phase control can be flexibly changed without changing various kinds of device constituting the working system and the standby system.

The phase communication method according to the above embodiments is applicable not only to the communication device such as the transmission device but also to various kinds of information processing apparatus having a redundant configuration to carry out the phase control. In the above embodiments, an example of a redundant configuration including the working system and the standby system has been described. However, the present invention is also applicable to other devices having other redundant configurations.

According to an embodiment of the present invention, the clock supplier compares a clock returned from the clock supply destination with a comparison reference clock of which phase coincides with the phase of the clocks of all clock suppliers, and adjusts the delay amount to be added to the clock so that the phase of the clock coincides with the phase of the comparison reference clock. Therefore, the phases of the clocks supplied from the clock suppliers to the clock supply destinations can be coincided with each other in all redundant systems.

According to an embodiment of the present invention, a clock once transmitted to the clock supply destination is returned to the clock supplier, and the phase difference is corrected using this returned clock as the clock to be compared. Therefore, the phase difference attributable to the individual differences of various parts on the route on which the clock is transmitted can be corrected in high precision.

According to an embodiment of the present invention, the phase difference is corrected using the variable delay circuit. Therefore, the phase difference generated due to various factors can be flexibly coped with.

According to an embodiment of the present invention, clocks are not compared between the systems, and each system can independently operate to execute phase control. Therefore, each system can be operated flexibly.

According to an embodiment of the present invention, the comparison reference clock is generated by adding a fixed delay to the clock before being added with a delay. Therefore, the phase difference can be corrected by only controlling to increase the delay amount of the variable delay circuit, by generating the comparison reference clock of which phase is delayed from that of the clock returned from the clock supply destination.

According to an embodiment of the present invention, the phase-difference control unit which is independently provided obtains the phase difference between the phase of the clock returned from the clock supply destination and the phase of the clock before the clock is returned. Based on this information, the delay amount to be added to the clock supplied to the clock supply destination is adjusted. Therefore, the phases of the clocks supplied from the clock supplier to the clock supply destination can be coincided with each other in all redundant systems.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An information processing apparatus, comprising plural combinations of a clock supplier and a clock supply destination supplied with a clock from the clock supplier, wherein
   the clock supply destination includes
      a first receiver that receives the clock supplied from the clock supplier;
      a first transmitter that transmits the clock received by the first receiver to the clock supplier; and
      a return route through which the clock is transmitted from the first receiver to the first transmitter, and
   the clock supplier includes
      a second transmitter that transmits the clock to the first receiver;
      a second receiver that receives the clock transmitted from the first transmitter;
      a variable delay unit that adds a delay of a variable amount to the clock to be supplied to a corresponding clock supply destination from the second transmitter;
      a comparison-reference-clock supply unit that supplies a comparison reference clock having the same phase as that of a comparison reference clock supplied from other clock supplier;
      a phase comparator that compares the phase of a return clock received by the second receiver with the phase of the comparison reference clock supplied from the comparison-reference-clock supply unit; and
      a phase-difference control unit that controls the delay added by the variable delay unit, so that the phase of the return clock coincides with the phase of the comparison reference clock, based on a result of comparison by the phase comparator.

2. The information processing apparatus according to claim 1, wherein the comparison-reference-clock supply unit generates and supplies the comparison reference clock by adding a fixed delay of a predetermined size to a clock branched before the clock is added with the delay by the variable delay unit.

3. A phase control method in an apparatus that includes plural combinations of a clock supplier and a clock supply destination supplied with a clock from the clock supplier, the method comprising:
   in the clock supplier, adding a delay of a variable amount to the clock to be supplied to a corresponding clock supply destination from a second transmitter;

in the clock supply destination, transmitting a clock received by a first receiver to a second receiver in a corresponding clock supplier from a first transmitter;

in the clock supplier, supplying a comparison reference clock having the same phase as that of a comparison reference clock supplied from other clock supplier;

in the clock supplier, comparing the phase of a return clock returned from the first transmitter to the second receiver with the phase of the comparison reference clock supplied; and in the clock supplier, controlling the delay added, so that the phase of the return clock coincides with the phase of the comparison reference clock, based on a result of the comparing.

4. The information processing method according to claim 3, wherein the comparing includes generating and supplying the comparison reference clock by adding a fixed delay of a predetermined size to a clock branched before the clock is added with the delay.

* * * * *